(12) United States Patent
Jeancolas

(10) Patent No.: US 10,489,519 B1
(45) Date of Patent: Nov. 26, 2019

(54) ASSEMBLY CONNECTIVITY MANAGER

(71) Applicant: MSC.Software Corporation, Newport Beach, CA (US)

(72) Inventor: Hugues Jeancolas, Newport Beach, CA (US)

(73) Assignee: MSC.SOFTWARE CORPORATION, Newport Beach, CA (US)

( * ) Notice: Subject to any disclaimer, the term of this patent is extended or adjusted under 35 U.S.C. 154(b) by 994 days.

(21) Appl. No.: 14/536,547

(22) Filed: Nov. 7, 2014

(51) Int. Cl.
*G06F 17/50* (2006.01)

(52) U.S. Cl.
CPC .................................. *G06F 17/50* (2013.01)

(58) Field of Classification Search
None
See application file for complete search history.

(56) References Cited

U.S. PATENT DOCUMENTS

| 6,718,218 B1* | 4/2004 | Matheson | G06F 17/50 700/118 |
| 2003/0229476 A1* | 12/2003 | Naganarayana | G05B 17/02 703/1 |

\* cited by examiner

*Primary Examiner* — Craig C Dorais
(74) *Attorney, Agent, or Firm* — Foley & Lardner LLP

(57) ABSTRACT

Systems and methods are described for providing a connectivity manager for managing connection representations and part representations of a model, including, but not limited to, displaying a structural assembly representation of a physical object, the structural assembly representation comprising a plurality of parts and a connection connecting at least two of the plurality of parts, and at least one of: selecting a first connection representation to associated with the connection, and selecting a plurality of part representations, each of the plurality of part representations is associated with one of the plurality of parts.

21 Claims, 17 Drawing Sheets

ASSEMBLY CONNECTIVITY MANAGER

BACKGROUND OF THE INVENTION

The present disclosure relates generally to the field of object-based model design and simulation. The present disclosure relates more specifically to providing part and connection representations management for object-based model design and simulation.

Object-based design and simulation tools (e.g., finite element, computer aided design, computer aided engineering, and the like) aid users in designing and simulating virtual models to evaluate characteristics of objects based on which the virtual models are generated. In particular, user-friendliness, clarity, and visual perception are valued in object-based design and simulation tools, as they promote efficient and accurate designing and simulating of object-based models.

Assembly product structures may be classified into at least two categories: parts and connections. Typical design and simulation tools provide model browsers (e.g., in a heretical view) for designing and managing connections. Such ways of managing the connections do not grant the users clear views of the connection being managed, and are often causing the users to be designing and simulating "in the dark." Thus, a need for methods and systems to allow easy visualization and management of parts and connections is felt. In addition,

SUMMARY OF THE INVENTION

Embodiments described herein related to systems and methods for providing connectivity management. For example, embodiments include a method including, but not limited to, displaying a structural assembly representation of a physical object, the structural assembly representation including a plurality of parts and a connection connecting at least two of the plurality of parts; and at least one of: selecting a first connection representation to associated with the connection; and selecting a plurality of part representations, each of the plurality of part representations is associated with one of the plurality of parts.

In some embodiments, the method further including grouping the connection representation and the at least two of the plurality of part representations in a group representation, wherein: the group representation is displayed in a first level of abstraction; the part representations and secondary connection representation(s) other than contained in the group representation are displayed in a second level of abstraction; and the first level of abstraction is more detailed than the second level of abstraction.

In various embodiments, the first connection representation is displayed in a first level of abstraction; a first part representation of the plurality of part representations is displayed in a second level of abstraction; and the first level of abstraction is more detailed than the second level of abstraction.

According to some embodiments, the method further includes displaying the first part representation in a third level of abstraction, the third level of abstraction is more detailed than the second level of abstraction; and receiving user input regarding an interface between the first connection representation and the first part representation.

In some embodiments, the selecting the first connection representation includes: displaying a plurality of connection representations; and receiving a user input indicating the first connection representation.

In some embodiments, the selecting the plurality of part representations includes: displaying potential part representations; and receiving a user input indicating the plurality of part representations.

In various embodiments, the method further includes determining connectivity validity between the first connection representation and one of the plurality of part representations, wherein determining connectivity validity includes at least one of: evaluating the connectivity validity between the first connection representation and one of the plurality of part representations based on validity verification results obtained for validity verification of the structural assembly representation executed based on the first connection representation and the one of the plurality of part representations; and accepting a user input indicating the validity of the first connection.

In further embodiments, the connectivity validity between the first connection representation and the one of the plurality of part representations is determined based on at least one attribute associated with at least one of the first connection representation and the one of the plurality of part representations.

Various embodiments include displaying the connection representation and the plurality of part representations in a three-dimensional interface.

In further embodiments, the method includes displaying the assembly representation in one of: a first level of abstraction; and a second level of abstraction, wherein the first level of abstraction is more detailed than the second level of abstraction.

According to various embodiments, a computer-readable medium is described and contains computer instructions which, when executed, causes a processor of a computer to: display a structural assembly representation of a physical object, the structural assembly representation including a plurality of parts and a connection connecting at least two of the plurality of parts; and at least one of: select a first connection representation to associated with the connection; and select a plurality of part representations, each of the plurality of part representations is associated with one of the plurality of parts.

In some embodiments, the processor is further caused to group the connection representation and the at least two of the plurality of part representations in a group representation, wherein: the group representation is displayed in a first level of abstraction; the part representations and secondary connection representation(s) other than contained in the group representation are displayed in a second level of abstraction; and the first level of abstraction is more detailed than the second level of abstraction.

In some embodiments, to select the first connection representation includes: to display a plurality of connection representations; and to receive a user input indicating the first connection representation.

In some embodiments, to select the plurality of part representations includes: to display potential part representations; and to receive a user input indicating the plurality of part representations.

In various embodiments, the processor is further caused to determine connectivity validity between the first connection representation and one of the plurality of part representations, wherein to determine connectivity validity includes at least one of: to evaluate the connectivity validity between the first connection representation and one of the plurality of part representations based on validity verification results obtained for validity verification of the structural assembly representation executed based on the first connection representation and the one of the plurality of part representations; and to accept a user input indicating the validity of the first connection.

In some embodiments, the connectivity validity between the first connection representation and the one of the plurality of part representations is determined based on at least one attribute associated with at least one of the first connection representation and the one of the plurality of part representations.

According to some embodiments, the processor is further caused to display the connection representation and the plurality of part representations in a three-dimensional interface.

In various embodiments, the processor is further cause to display the assembly representation in one of: a first level of abstraction; and a second level of abstraction, wherein the first level of abstraction is more detailed than the second level of abstraction.

An apparatus is described with respect to various embodiments, the apparatus including means for displaying a structural assembly representation of a physical object, the structural assembly representation including a plurality of parts and a connection connecting at least two of the plurality of parts; and at least one of: means for selecting a first connection representation to associated with the connection; and means for selecting a plurality of part representations, each of the plurality of part representations is associated with one of the plurality of parts.

In some embodiments, the apparatus further includes means for grouping the connection representation and the at least two of the plurality of part representations in a group representation, wherein: the group representation is displayed in a first level of abstraction; the part representations and secondary connection representation(s) other than contained in the group representation are displayed in a second level of abstraction; and the first level of abstraction is more detailed than the second level of abstraction.

BRIEF DESCRIPTION OF THE DRAWINGS

The disclosure will become more fully understood from the following detailed description, taken in conjunction with the accompanying figures, wherein like reference numerals refer to like elements, in which.

DETAILED DESCRIPTION OF THE PREFERRED EMBODIMENTS

Figure 1:
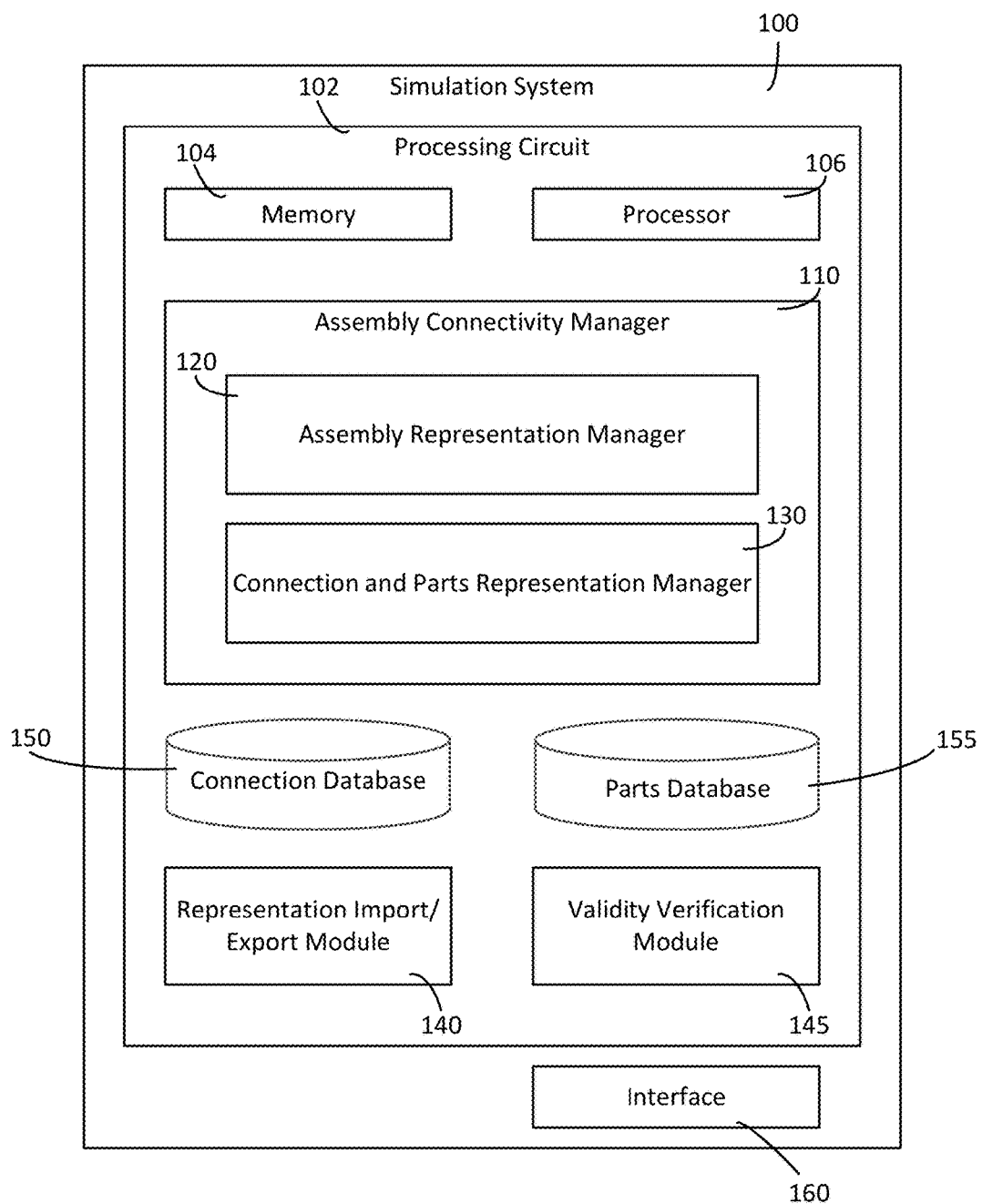
FIG. 1 is a block diagram illustrating an example of the ACM as implemented in a simulation system according to various embodiments.

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure may be practiced without these specific details. In some instances, structures and devices are shown in block diagram form in order to avoid obscuring the concepts of the present disclosure. Acronyms and other descriptive terminology may be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Referring generally to the figures, the implementations described herein relate to providing an assembly connectivity management for generating and editing a model. The assembly connectivity management may be embodied in an assembly connectivity manager (ACM). As referred to herein, a model (e.g., including part representation(s), connection representation(s), assembly representation, and/or the like) may include a finite element (FE) model, computer aided design (CAD), computer aided engineering (CAE), and/or the like. In particular, the ACM may manage the connection representations and part representations by providing tools for designing, editing, and/or validating the connection and part representations of the model. System including the ACM may link the features described herein to manufacturing process. For example, models having connection and part representations simulated and validated with the aide of the ACM may be manufactured or otherwise produced in any suitable process in real-time or at a subsequent time. In other embodiments, the ACM may provide an output to any simulation software.

Embodiments of the present disclosure relate to object modeling and assembly interface of parts and connections. A physical object may be modeled in a suitable manner and in any suitable format for simulating and validating the physical object, or a design of a physical object. Thus, representation of the physical object as a whole may be referred to herein as "assembly representation" or "object representation." In some embodiments, the physical object may be designed virtually in a suitable manner. In some other embodiments, the physical object may be a basis of the assembly representation. For example, scans, photography, and/or other structural imaging techniques may be used to capture the characteristics of the physical object, where such characteristics may be converted into signals to relay to the ACM.

As used herein, the physical object may include "parts," which may be components forming the physical object. For example, a landing gear of an aircraft may include parts such as wheels, axles, harnesses, struts, various support frames, and/or the like. A "part representation" refers to the representation of that part in a model. In addition, the physical object may include at least one "connection." Each connection may join two or more parts. In other words, the connection may refer to a mechanical and/or electrical coupling for operatively coupling two parts. The coupling may be rigid or flexible. Connections may include sleeves, flange, shaft locks, hirth, clamp, fasteners, joints, glue, hinges, translators, beams, diaphragm, discs, gears, fluid, Oldham, a combination thereof, and/or the like. In an additional example, a mere contacting edge or surface between two parts, without more, may be a connection. A "connection representation" refers to the representation of that connection in a model.

In various embodiments, the ACM may provide an interface (e.g., a canvas interface) to allow a user to manage an assembly representation that include part representations and connection representations. In particular, the ACM may enable the user to design, view, edit, and/or validate part representations and associated connection representations therebetween.

In some embodiments, the ACM may be configured to display different levels of abstraction when representing the parts and the connections. As used herein, a "level of abstraction" may refer to a number of features of the components of the model are shown during creation or modification of the model. Additionally, the level of abstraction may refer to a number of components of the model are visible to a user during creation or modification of the model, also commonly understood as a "level of details." In other words, the user can adjust the level of abstraction to adjust how much detail to render on the computer program displaying the model. It should be understood that all components (e.g., parts, connections, representations thereof, and/or the like) are actually parts of the model, but may or may not be displayed based on the level of abstraction set by the user.

For example, the ACM may display relatively idealized levels of abstraction of parts and connections (e.g., less detailed, high-level, and simple representations of the physical objects). On the other hand, the ACM may display relatively realized levels of abstraction of parts and connections (e.g., a more detailed, faithful, and refined representations of the physical objects). A plurality of levels of abstraction may be displayed by the ACM (i.e., the ACM may display representations in a most idealized level of abstraction, a most realized level of abstraction, and one or more levels of abstraction therebetween. The levels of abstraction may be arranged from the most idealized level in an increasing order of realization (e.g., toward the most realized level, vice versa). In some embodiments, the users may provide (e.g., through an interface provided by the ACM manager or otherwise) the part representations and connection representations of an assembly representation in different levels of abstraction. Accordingly, flexibility can be achieved by allowing the user to switch representation abstraction levels during designing, viewing, editing, and configuring of part representations and connection representations.

In further embodiments, the ACM may display assembly representations in their entirety in different levels of abstraction in a similar manner. For example, an entire assembly representation (which may include part representation and connection representations) may be reduced to a most idealized level (e.g., the assembly representation may be reduced to a single dot or line). The entire assembly representation may correspond to a moment of inertia, a mass, and the like associated with assembly as embodied in a dot or line, or of any other basic 3-dimensional or 2-dimensional shapes. The assembly representation may also be displayed in a most realized level (e.g., the entire assembly may be displayed in the most detailed manner).

Accordingly, the ACM allows the user to manage assembly representation in at least one of the following manners: 1) allowing the user to design/validate/edit an assembly representation based on a combination of part representations and connection representations; and 2) allowing the user to design/validate/edit an assembly representation defined based on a user-defined representation with respect to the entire assembly representation (e.g., with a point of mass, dot, or line).

It should be appreciated that one or more levels of abstraction between the most idealized and the most realized levels of abstraction may be provided to grant flexibility in the manner described. In fact, the assembly representation may be configured as a collection of part representations and connection representations. Accordingly, the ACM may be capable of providing large-scale designing, viewing, editing, validating, and configuring of models of complex physical objects. Particularly, copying and pasting functions may be provided for representations (e.g., part, connection, and/or assembly) in varying levels of abstraction.

In further embodiments, the ACM may display the parts and connections in various different levels of abstraction simultaneously. For example, the ACM may display some parts (e.g., the active part representations and connection representations of interest to the user) in relatively more realized levels of abstraction while displaying other parts (e.g., the inactive part representations and connection representations not interacting with the user) in relatively more idealized levels of abstraction.

Part representations of a given part may include, but not limited to, rigid body representations, finite element models, computation parts, point masses, rotary inertia, transfer functions, connections, and the like. Connection representations may include representations for kinematic constraints, kinematic joints, contact and glue interactions, bolts, welds, and the like.

The ACM may allow at least one group representation of multiple group representations to be selectable by the user for designing, viewing, editing, and/or validating. In various embodiments, a connection representation may be displayed with its associated two or more part representations as a group representation. In various embodiments, the details of the connection representation (e.g., type of connection, dimensions, material, flexibility configuration results, and/or the like) may be displayed as textual and/or graphical indicators. The ACM may be configured to allow the user to view, edit, configure and/or validate the part representations and the connection representations in a viewing environment that supports 3-dimensional (or 2-dimensional) display. Accordingly, the user may manage the part representations and connection representations with ease given that structural relationships between the part representations and connection representations (as well as group representations) are readily ascertainable from display associated with the ACM.

The ACM may allow selection (manually by accepting a user input or automatically based on predetermined rules or policies) of a particular connection representation for a connection and a particular part representation for a part. In the manual selection context, the ACM may display two or more disparate connection representations for a same connection as user interactive elements. The two or more disparate connection representations may be displayed in any suitable manner including, but not limited to, a side-by-side display, as a replacement, in a pop-up window, in a bubble window, a combination thereof, and/or the like. The user may proceed with selecting one of the two or more disparate connection representations for the connection. Similarly, the ACM may display two or more disparate part representations for a same part as user interactive elements. The two or more disparate part representations may be displayed in any suitable manner including, but not limited to, a side-by-side display, as a replacement, in a pop-up window, in a bubble window, a combination thereof, and/or the like. The user may proceed with selecting one of the two or more disparate part representations for the part.

The ACM may allow at least one group representation of a plurality of group representations to be selectable. When selected, the group representation of interest may be displayed in a different level of abstraction (e.g., in a more realized level of abstraction) as compared to the unselected part/connection representations. The group representation of interest may be displayed in various suitable manners including, but not limited to, in a side-by-side display, as a replacement, in a pop-up window, in a bubble window, a combination thereof, and/or the like with respect to representation of the group in other levels of abstraction.

The ACM may determine whether the connectivity between the connection representation and at least one part representation within the group representation is valid (i.e., based on attributes of the connection representation such as, but not limited to, the type of connection representation, realized connectivity, the characteristics, and/or the like). In some embodiments, the ACM may allow user input as to the validity between the connection representation and the part representation. For example, when a part representation or a connection representation has been changed (to a different representation or to a different level of abstraction), the user may be provided a platform to input how the part representation "grabs" onto the connection representation, vide versa. In other embodiments, the ACM may automatically resolve the validity based on user-defined rules with respect to the connection representation (e.g., validity verifications). For example, validity verification processes for the group representation and/or the assembly representation may indicate faulty connection when there are one or more of lack of sufficient connection definition, connection orientation, properties, application region, and/or the like. When a faulty connection representation is identified in any suitable manner, the indicators may be shown in a different graphical state to notify the user of the faulty connection representation.

The ACM may provide for the user to edit a connection representation when that connection representation is found to be faulty or potentially faulty. For example, the user may manually reselect the connection representation (and/or part representations), alter the dimensions and characteristics of the current connection representation (and/or part representations), modify connection representations (and/or part representations) of other group representations, select nodes/points of contact, change the level of abstraction, a combination thereof, and/or the like. In other embodiments, the ACM may automatically propose resolution strategy based on suitable user-defined rules. In particular, iterative methods guided by user-inputs may be implemented suggestions to determine the type/characteristics of the connection representation to yield a valid connectivity.

Similar implementations are applicable to all group representations within the assembly representation as well as other assembly representations within the same model. A valid assembly representation may be obtained when all connection (and part) representations therein are found to be valid. Given that the connection representation of one group representation is likely to affect the validity of another connection representation of another group representation, an iterative method may be used accordingly to arrive at the valid assembly representation.

FIG. 1 is a block diagram illustrating an example of the ACM 110 as implemented in a simulation system 100 according to various embodiments. The simulation system 100 may include a processing circuit 102 and an interface 160. The processing circuit 102 may be part of a workstation computer or other suitable types of computing device. The processing circuit 102 may include various modules for executing various functions described herein. The processing circuit 102 may include memory 104, processor 106, the ACM 110, connection database 150, parts database 155, representation import/export module 140, validity verification module 145, and/or the like. The simulation system 100 may include other devices such as a network system, wireless or wired communications systems, printers, and/or the like for performing common functions associated therewith.

The processor 106 may be configured to be coupled to the ACM 110 to execute the functionalities and features of the ACM 110 described herein. The processor 106 may receive instructions from the interface 160 related to the functions described. The processor 106 may additionally be coupled to the connection database 150, parts database 155, representation import/export module 140, validity verification module 145, and/or the like for executing features described herein. For example, the processor 106 may receive assembly representation of a physical object, virtualize the physical object into the assembly representation, design the assembly representation, manage connections and parts, execute simulations based on the assembly representation, a combination thereof, and/or the like.

The processor 106 may include any suitable data processing device, such as a general-purpose processor (e.g., a microprocessor), but in the alternative, the processor 106 may be any conventional processor, controller, microcontroller, or state machine. The processor 106 may also be implemented as a combination of computing devices, e.g., a combination of a DSP and a microprocessor, a plurality of microprocessors, at least one microprocessors in conjunction with a DSP core, or any other such configuration. For example, the processor 106 may be, but is not limited to being, an Intel® designed processor, AMD® designed processor, Apple® designed processor, QUALCOMM® designed processor, or ARM® designed process.

The memory 104 (or storage device) may be operatively coupled to the processor 106 and may include any suitable device for storing software instructions and data for controlling and use by the processor 106 to perform operations and functions described herein, including, but not limited to, random access memory RAM, read only memory ROM, floppy disks, hard disks, dongles or other RSB connected memory devices, or the like. The memory 104 may include non-transitory storage media that is configured to store information regarding a geometric model that is being currently modified or was created in the past and/or computer readable instructions for the processes performed by the processor as described.

The memory 104 may send or receive data to or from the processor 106 and each of the modules/components in the simulation system 100. In some embodiments, the memory 104 may be a remote storage device that stores data for the simulation system 100 (or only the processing circuit 102) in a different node within a network from at least one module (e.g., the interface 160, the ACM 110, the representation import/export module 140, the validity verification module 145, a combination thereof, or the like) of the simulation system 100. In other embodiments, the memory 104 may be located on the same computer system (e.g., within the same node of the network) as the interface 160, the ACM 110, the representation import/export module 140, the validity verification module 145, a combination thereof, or the like. In various embodiments, the memory 104 may include the connection database 150 and/or the parts database 155.

In various embodiments, the ACM 110 may generally be configured to execute the methods described herein with respect to assembly connectivity management. The ACM 110 may be a computer system in communication with processor 106, memory 104, and interface 160. In some implementations, (instructions for) the ACM 110 may be stored on a non-transitory storage medium, which may be, in some cases the memory 104. The ACM 110 may be located in a same or different network node from the interface 160. For example, the ACM 110 may communicate with the interface 160 through a (wired or wireless) network. Accordingly, ACM 110 may be a cloud-based system that provides software as a service. In typical embodiments, the ACM 110 may enable visualization and management of the part representations and the connection representations of the assembly representation in the manner described. Furthermore, the ACM 110 may include the assembly representation manager (ARM) 120 and the connection and parts representation manager (CPRM) 130.

In some embodiments, the ARM 120 may be coupled to the interface 160 to enable the user a logical view of the part representations and the connection representations of the assembly representation (e.g., the model of the physical object). In particular, the ARM 120 may enable a canvas display of the assembly representation via the interface 160. For example the canvas display may enable 1-dimensional, 2-dimensional, and/or 3-dimensional display of the part representations and connection representations, where the dimensional display may be selectable by the user or set automatically. The canvas display may also enable display of the part representations and connection representations in exploded views. The user may rotate, elevate, zoom on the assembly representation, which may include the connection representations and part representations. Accordingly, the ARM 120 may enable view-altering, 3-dimensional viewing of connection representations and their associated part representations. Thus, the user can view a connection representation and its associated part representations being displayed in a graphical manner to better determine the relationships between the connection representation and its associated part representations. As such, user may select, reselect, simulate, and validate the fitness of the connection representation with ease.

In various embodiments, the ARM 120 may display the assembly representation in various levels of abstraction. For example, the ARM 120 may display the same assembly representation in realized and/or idealized abstractions as a selectable viewing format of the representations. The idealized abstraction of the assembly representation, part representations, and connection representations, separately or as a whole may refer to a high level, simplified representations of the corresponding part and connection (e.g., as modeled based on the physical object). In specific embodiments, the idealized abstraction representation of a part may be a line while the idealized abstraction representation of a connection may be a dot between two or more lines. In other words, the idealized abstraction representations may include less virtualized detail/characteristics as compared to the realized abstraction representations.

On the other hand, the realized abstraction representation of the assembly representation may be a detailed, specific, and/or complex representations of the corresponding part and connection (e.g., as modeled based on the physical object). In specific embodiments, the idealized abstraction representation of a part or a connection may resemble the actual physical objects.

In various embodiments, the ARM 120 may display (e.g., by causing the interface 160 to display) the representations in various abstraction levels ranging from the most idealized representations (e.g., sticks for parts and dots for connections) to the most realized representations (e.g., strong physical likeness to the physical object). As the abstraction level of a part/connection becomes increasingly realized, more details of the corresponding part/connection may be added. As described, the ARM 120 may display at least a portion of the assembly representation in one abstraction level while displaying a disparate portion of the assembly representation in a disparate abstraction level. That is, at least one connection representation (and its associated part representations) may be displayed in one abstraction level while at least a disparate connection representation (and its associated part representations) may be displayed in a disparate abstraction level (e.g., a comparatively idealized level).

As implemented in some embodiments, the CPRM 130 may focus on one specified connection representation and its associated two or more part representations. In some embodiments, the CPRM 130 may cause the interface 160 to display the specified connection/part representations (e.g., as selected by the user or automatically according to predefined instructions) and its associated part representations in a specialized manner for presenting the connection/part representation as representations of interest to the user. The specialized manner may refer to a highlighted manner, within a box, in a pop-up window, in an abstraction level different from the rest of the assembly representation, a combination thereof, and/or the like.

In various embodiments, the ARM 120 and the CPRM 130 may enable the user to modify the connection representations (as well as part representations) corresponding to a connection. For example, the ARM 120 and the CPRM 130 may enable the user to select the type of connection/part representation as well as the dimensions, nodes/point, and/or other attributes of the connection/part representations via the interface 160. In addition, the CPRM 130 may allow the user to fix connectivity problems that have arose.

As used herein, at least a portion the features of the ARM 120 and the CPRM 130 may operate closely or is intertwined. Thus, the ACM 110 may be used herein to refer collectively to both the ARM 120 and the CPRM 130.

In some embodiments, the connection database 150 may be any non-transitory storage medium (e.g., the memory 104) configured to store various types of connection representations. For example, the connection database 150 may include graphical representations of different connection representations for various different levels of abstractions and/or for different dimensional displays. The connection database 150 may store data related to connection representations including, but not limited to, sleeves, flange, shaft locks, hirth, clamp, fasteners, joints, glue, hinges, translators, beams, diaphragm, discs, gears, fluid, Oldham, and the like.

In further embodiments, the connection database 150 may store various attributes for different types of connection representations described. The attributes may include the dimensions (e.g., length, width, height, radius) of the connection representations. The attributes may also include other characteristics of the connection representation, including material characteristics (e.g., flexibility, durability, material composition, color), node positions for snapping/grabbing into part representations, and the like. In some embodiments, the attribute values (e.g., for sets of attributes) may be predefined for some connection representations and stored within the connection database 150. In some other embodiments, the attribute values for connection representations may be imported a virtualization process (e.g., from the representation import/export module 140). User-defined attributes or attribute values may be stored in the connection database 150 during the designing and/or the modification process described herein. The attribute values for each attribute associated with the connection representation may vary during the modification process. Accordingly, modifications in attribute values may lead to modifications to the visual representation (e.g., for different levels of abstraction and/or for different dimensions of display) and modifications of validity results for the combination of connection/part representations.

Similarly, the parts database 155 may store various attributes for different types of part representations described. The attributes may include the dimensions (e.g., length, width, height, radius) of the part representations. The attributes may also include other characteristics of the part representations, including material characteristics (e.g., flexibility, durability, material composition, color, node positions for snapping/grabbing onto the connection of other part representations, and the like. In some embodiments, the attribute values (e.g., for sets of attributes) may be predefined for some part representations and stored within the part database 155. In some other embodiments, the attribute values for part representations may be imported a virtualization process (e.g., from the representation import/export module 140). User-defined attributes or attribute values for part representations may be stored in the part database 155 during the designing and modification process described herein. The attribute values for each attribute associated with the party representation may vary during the modification process. Accordingly, modifications in attribute values may lead to modifications to the visual representation (e.g., for different levels of abstraction and/or for different dimensions of display) and modifications of validity results of the combination of connection/part representations.

In some embodiments, the representation import/export module 140 may be configured to import model data of the physical object to the ACM 110 for connectivity management in the manner described. In some embodiments, the representation import/export module 140 may import virtualized model data or user-designed model data (through the interface 160) corresponding to the physical objects. Model data imported by the representation import/export module 140 may be stored within the memory 104, the connection database 150, and the parts database 155. The representation import/export module 140 may send model information to the ACM 110 for graphically displaying the model (e.g., in the form of the assembly representation) in disparate abstraction levels and dimensions. Additionally, the representation import/export module 140 may export the assembly representation and its associated data to a separate module within the simulation system 100. The representation import/export module 140 may export the representation data to the validity verification module 145 for object model-based simulation. The representation import/export module 140 may be coupled to the processor 106 and the memory 104 to execute the features described herein.

The validity verification module 145 may receive representation data from the ACM 110 and/or the representation import/export module 140 and execute validity verifications based on the representation data. In some embodiments, the validity verification module 145 may perform connectivity validity checks for connection/part representations based on connection attributes as well as associated part attributes. A connection representation may be determined to be valid by validity verification module 145 when the results for the connectivity validity checks indicate that the connection representation meets a predetermined threshold (e.g., securely connecting the associated part representations, allowing for a predetermined degree of freedom, durable for a predetermined period of time, a combination thereof, and/or the like).

When a connection/part representation is switched (e.g., by the user) or the level of abstraction for that connection/part representation has been changed (e.g., by the user), the validity verification module 145 may verify if the ACM 110 has sufficient information to display valid connectivity. For example, when a single-node representation is switched to multi-node representation, the validity verification module 145 may verify if the ACM 110 has sufficient information to determine which node(s) should now be connected to other representations. The validity verification module 145 may require further user input to result insufficient information.

The validity verification module 145 may take into account other connection representations and part representations when determining the validity of the connection representation of interest. This is because the connection representations and part representations other than the connection representation (and its associated part representations) of interest may influence the behavior of the connection representation of interest. The validity verification module 145 may also perform simulation for two or more connection representations within a given assembly representation and determine the validity of each in a consequential or simultaneous manner.

In some embodiments, the interface 160 may include at least one input device for receiving input from a user and at least one display one device for relaying information to the user. For example, the input device may include a computer with a monitor, keyboard, keypad, mouse, joystick, touch screen display, or other input devices performing a similar function. The input device may include a keyboard including alphanumeric and other keys, and may be connected to processing circuit 102 (e.g., the processor 106 and the memory 104) for communicating information and command selections. The input device may include a touch screen interface or movement sensing interface that may be combined with, or separated from, the display device of the interface 160. The input device may include a cursor control device, such as, but not limited to, a mouse, trackball, touch screen, motion sensor, cursor direction keys, and the like. Such input device may control cursor movement on the display device. The display device of the interface 160 may be any type of display (e.g., CRT display, LCD display, etc.) configured to provide audio and/or visual output to the user of the simulation system 100 and/or the ACM 110.

Figure 2:
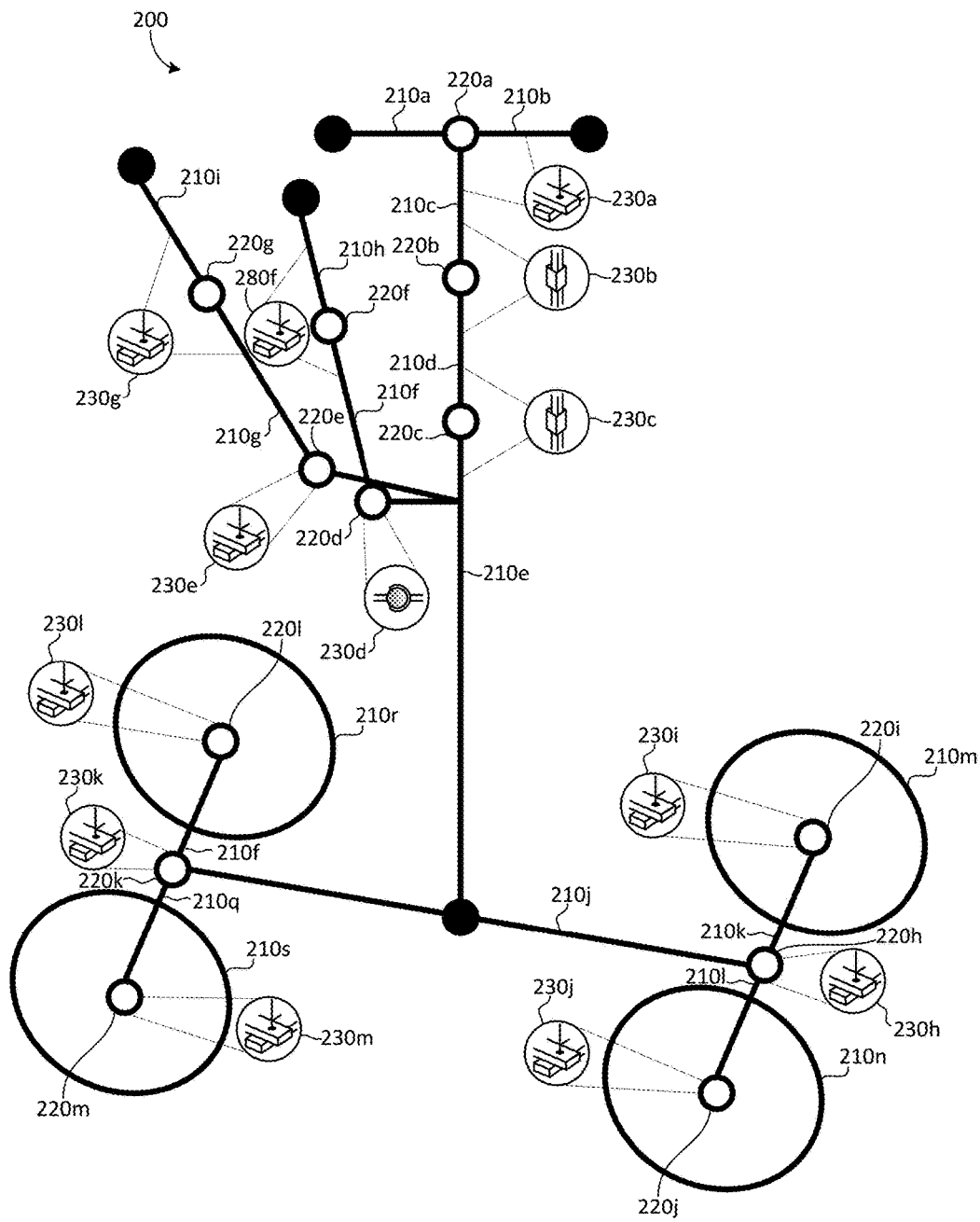
FIG. 2 illustrates an example of a first screen display of an assembly representation according to various embodiments.

FIG. 2 illustrates an example of a first screen display 200 of an assembly representation according to various embodiments. Referring to FIGS. 1-2, the ACM 110 may cause the interface 160 to display the first screen display 200. The first screen display 200 may include an assembly representation of a model of a physical object (e.g., a landing gear of an aircraft). The assembly representation of first screen display 200 may be based on the model data imported from the representation import/export module 140. The first screen display 200 includes at least one part representation (e.g., a part representation A 210*a*, part representation B 210*b*, . . . part representation S 210*s*), at least one connection (e.g., a connection A 220*a*, connection B 220*b*, . . . , connection M 220*m*), at least one connection representation indicator (e.g., a connection representation indicator A 230*a*, connection representation indicator B 230*b*, . . . , connection representation indicator M 230*m*).

In some embodiments, AMC 110 may cause the interface 160 to display the assembly representation in an idealized abstraction representation (e.g., a sticks-and-dots abstraction representation). For example the part representations 210*a*-210*s* may be represented by sticks while the connections 220*a*-220*m* may be represented by dots (circles). The idealized abstraction representation of the assembly representation may display to the user the structural character of the physical object while showing less detail (as compared to the realized abstraction levels) for improved clarity and processing/load time.

For each connection, a connection representation indicator (e.g., the connection representation indicator A 230*a*, connection representation indicator B 230*b*, . . . , connection representation indicator M 230*m*) may be provided to illustrate a type of connection representation selected for a corresponding connection. In a non-limiting example, the part representation A 210*a* and the part representation B 210*b* may be joined by the connection A 220*a*. The connection representation indicator A 230*a* may show that a hinge connection may be selected (e.g., by the user or automatically based on model information from the representation import/export module 140) for the connection A 220*a*. In another non-limiting example, the part representation C 210*c* and the part representation D 210*d* may be joined by the connection B 220*b*. The connection representation indicator B 230*b* may show that a sleeve connection may be selected for the connection B 220*b*. In yet another non-limiting example, the part representation E 210*e* and the part representation F 210*f* may be joined by the connection D 220*d*. The connection representation indicator D 230*d* may show that a sleeve connection may be selected for the connection D 220*d*.

In some embodiments, the user may select one or more connection representations for each connections 220*a*-220*m*. In some embodiments, at least some of the connection representations may be selected automatically based on one or more attribute values of the part representations associated with a given connection. According to some embodiments, at least some of the connection representations may be selected based on the virtualization of the physical object (i.e., the ACM 110 may recognize a particular connection type based on the model data received from the representation import/export module 140).

The ACM 110 may cause the interface 160 to display the assembly representation in a 3-dimensional context (e.g., on the canvas display). Thus, the assembly representation (as displayed in the idealized level of abstraction representation) may be manipulated such that the user may view the assembly representation from different angles or distance. For example, the ACM 110 may allow the user to rotate and/or zoom the assembly representation to view any of the part representations 210*b*-210*s*, the connections 220*a*-220*m*, and/or the connection representations 230*a*-230*m*.

In various embodiments, the connection representations 230*a*-230*m* and the part representations 210*a*-210*s* may be simulated (alone or in combination) while the assembly representation is being displayed by the interface 160 (in any levels of abstraction and dimensional view). As such, any modifications in any of the connection representations 230*a*-230*m* and/or any of the part representations 210*a*-210*s* may immediately be taken account in the simulation and impact the simulation results. Modifications include modifying connection representation types, modifying dimensions, modify level of abstraction and/or material composition attributes of the connection representations. In other words, the AMC 110 allow simultaneous simulation of the assembly representation or any subpart thereof and the modification of connection representations 230*a*-230*m*.

In addition, modifications of one of the connection representations 230*a*-230*m* and/or part representations 210*a*-210*s* may impact the validity of another one of the connection representations 230*a*-230*m* and/or part representations 210*a*-210*s*. Thus, in some embodiments, upon receiving a modification command (e.g., via the interface 160), the ACM 110 may cause the validity verification module 145 to verify the modified connection representation and its associated part representations. User input may be required to rectify updated representation.

Figure 3A:
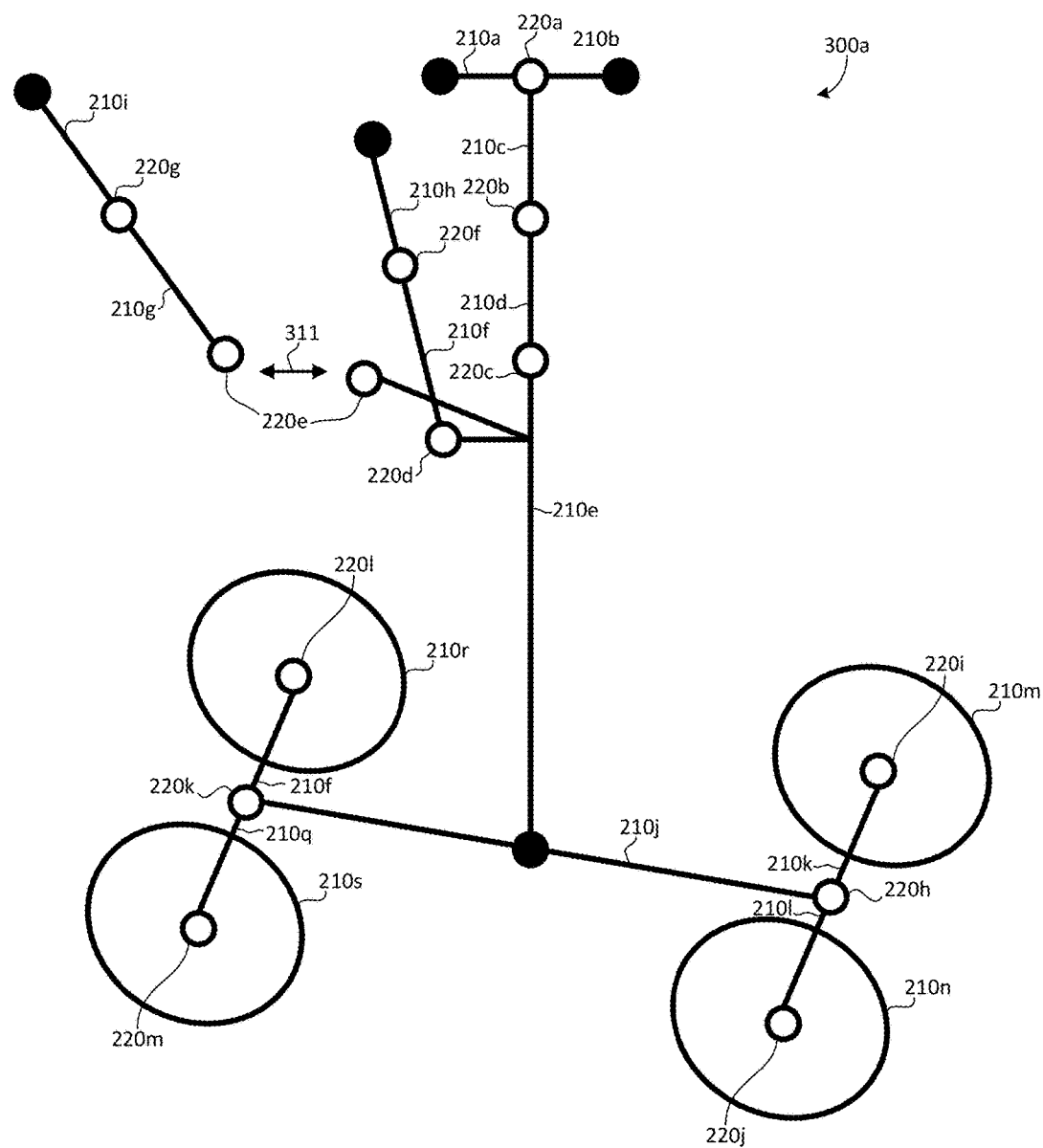
FIG. 3A illustrates an example of a second screen display of the assembly representation according to various embodiments.

FIG. 3A illustrates an example of a second screen display 300*a* of the assembly representation according to various embodiments. Referring to FIGS. 1-3A, the ACM 110 may cause the interface 160 to display the second screen display 300*a*. The second screen display 300*a* shows the state of the assembly representation during a designing/configuration stage. In particular, the third screen display 300a may be displayed when the connection E 220e is being designed and/or configured.

In some embodiments, a connection (e.g., the connection E 220e) may be designed and/or configured while the assembly representation (or a portion thereof containing the connection E 220e being designed and/or configured) in a 3-dimensional context and in an idealized representation. The user may therefore rotate and/or zoom on the assembly representation (or a portion thereof). It should be appreciated by one of ordinary skills in the art that the assembly representation (or a portion thereof) may also be displayed in other dimensional contexts or other levels of abstraction.

The connection E 220e is shown to be disconnected, and an indicator 311 emphasizes that the connection E 220e is being designed and/or configured. The user may be provided by the interface 160 with the option to choose a connection representation from a plurality of available connection representations and/or to design the users own connection representation. The user may also be provided with selecting attributes of the connection representation (e.g., in a pop-up window, a text field, a drop-down menu, a combination thereof, and/or the like). In other embodiments, the connection representation type and the attributes may be selected for the connection E 220e based on imported data from the representation import/export module 140.

Figure 3B:
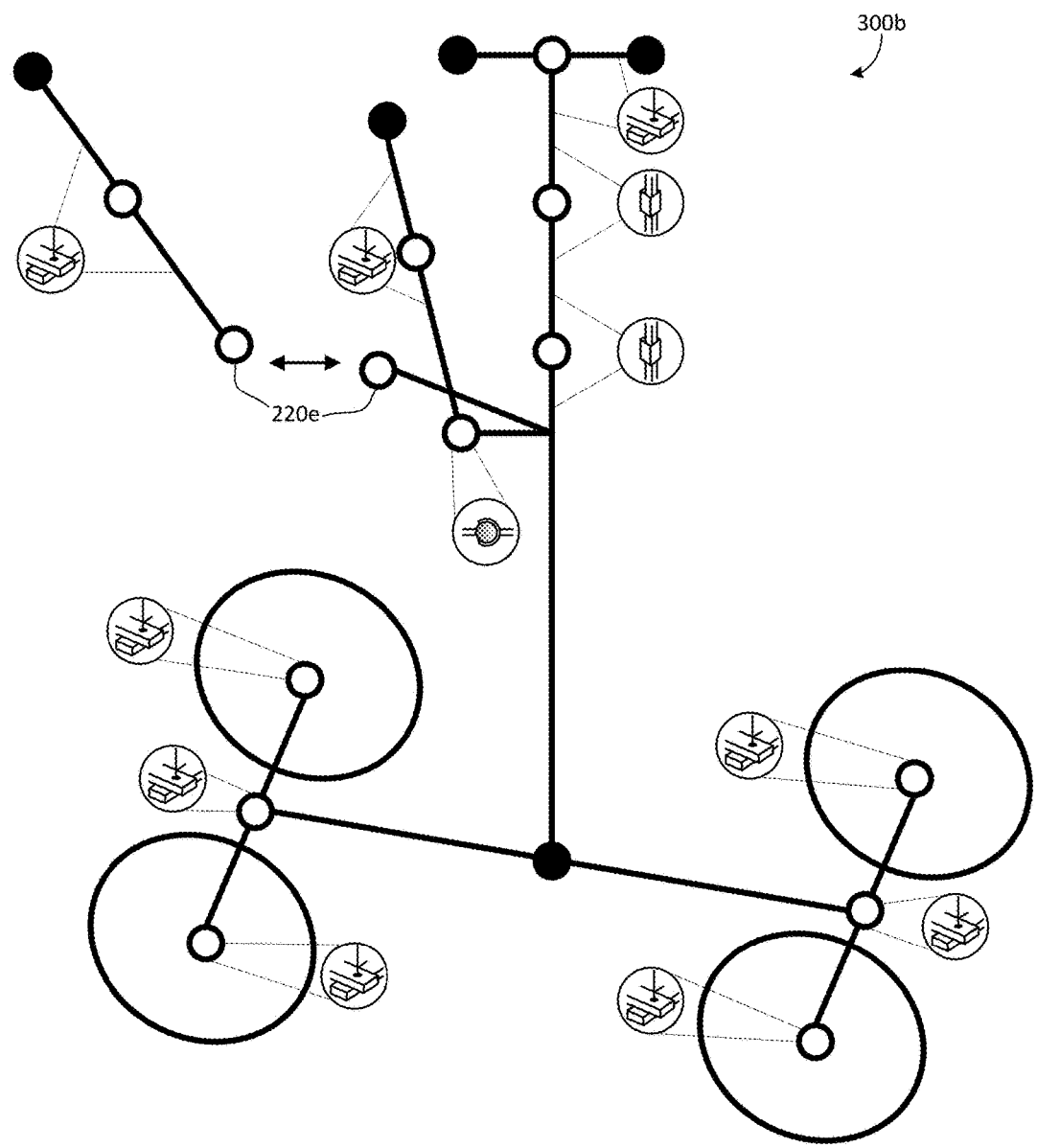
FIG. 3B illustrates an example of a third screen display of the assembly representation according to various embodiments.

FIG. 3B illustrates an example of a third screen display 300b of the assembly representation according to various embodiments. Referring to FIGS. 1-3B, the ACM 110 may cause the interface 160 to display the third screen display 300b. The third screen display 300b shows the state of the assembly representation during a designing/configuration stage. In particular, the third screen display 300b may be displayed when the connection E 220e is being designed and/or configured.

The third screen display 300b may display the connection representation indicators 230a-230d, 230f-230m for each respective connections 220a-220d, 220f-220m. In some embodiments, some connection representation indicators (e.g., the connection representation indicators 230a-230d, 230f-230m) may be included in the third screen display 300b when the connections (e.g., for each respective one of the connections 220a-220d, 220f-220m) corresponding to these connection representations have already been designed or validated.

Figure 3C:
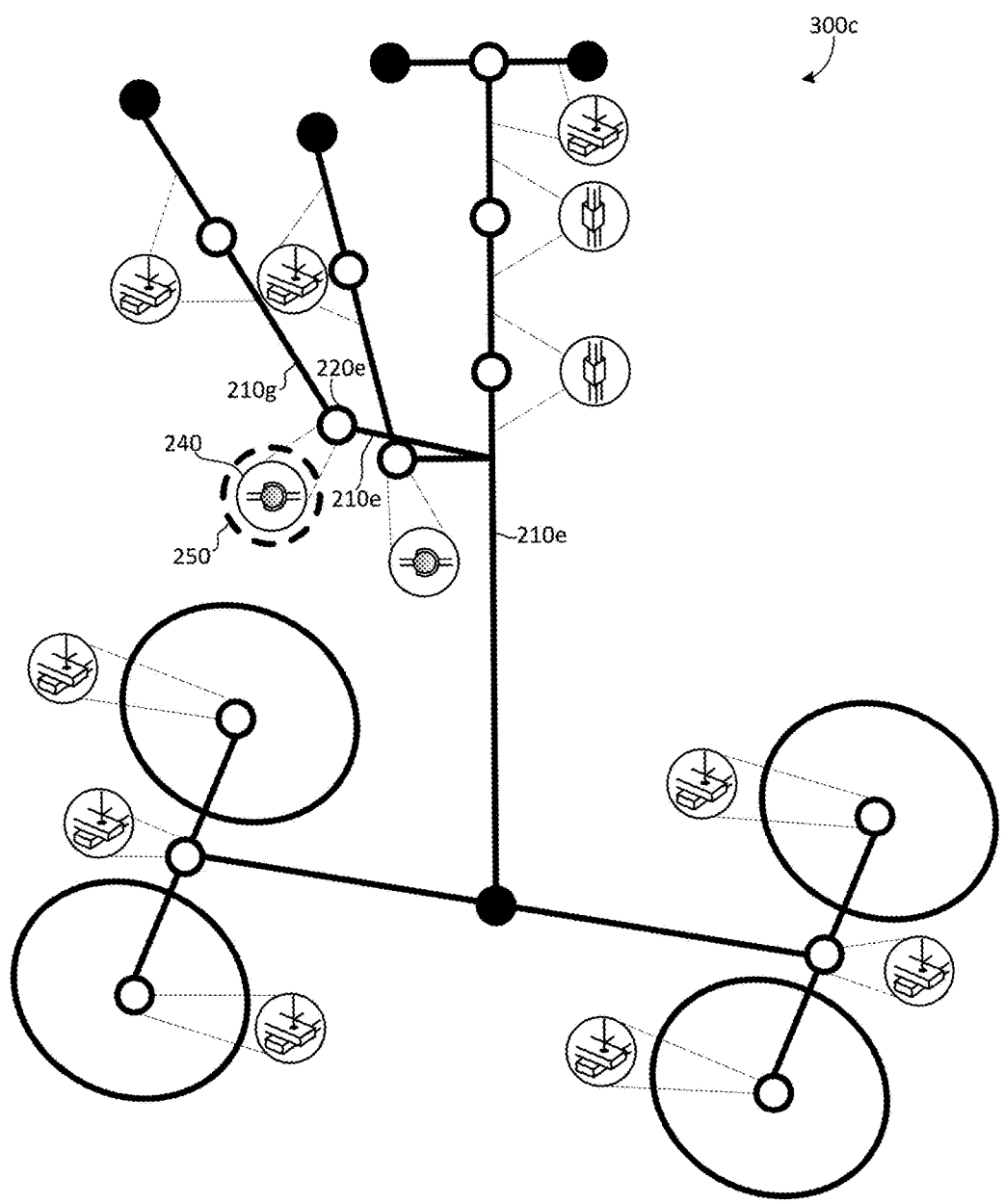
FIG. 3C illustrates an example of a fourth screen display of the assembly representation according to various embodiments.

FIG. 3C illustrates an example of a fourth screen display 300c of the assembly representation according to various embodiments. Referring to FIGS. 1-3C, the ACM 110 may cause the interface 160 to display the fourth screen display 300c. The fourth screen display 300c shows the state of the assembly representation during a designing/configuration stage. In particular, the fourth screen display 300c may be displayed when the connection E 220e is being designed and/or configured.

The fourth screen display 300c may include a first connection representation indicator 240, which is a ball-joint representation. The first connection representation indicator 240 may be selected by the user via the interface 160. In particular, the ACM 110 may cause the interface 160 to display a plurality of available connection representations (e.g., from a pop-up window, a drop-down menu, a combination thereof, and/or the like). For example, available connection representations may include any suitable mechanical and electrical connections such as, but not limited to, sleeves, flange, shaft locks, hirth, clamp, fasteners, joints, glue, hinges, translators, beams, diaphragm, discs, gears, fluid, Oldham, a combination thereof, and/or the like.

In some embodiments, the user may manually select one desirable connection representations via the interface 160. In further embodiment, the ACM 110 may recommend to or more types of connection representations based on attributes the part representations associated with the connection. For example, the connection E 220e joins the part representation E 210e and part representation G 210g. The ACM 110 may determine that the part representation E 210e and part representation G 210g may make an angle other than 180 degrees and require a freedom of movement relative to one another, and recommend a connection representation that allow for such freedom of movement and the angle (e.g., a ball joint, and/or the like). In another non-limiting example, the ACM 110 may determine that the part representation C 210c and part representation D 210d may make an 180 degree angle at the connection 220b, and the part representation C 210c and part representation D 210d may require fixed connection. Accordingly, the ACM 110 may require a sleeve connection as shown by the connection representation indicator 230b. As described, the attributes of the part representations 210a-210s and/or the connection representations 230a-230m may be define by the user via the interface 160 and/or automatically by the ACM 110. Recommended types of connection representation indicators may be displayed in a different graphical state as other types of connection representation indicators to alert the user of a recommendation.

In response to selecting the first connection representation indicator 240, the ACM 110 may allow the user to input attributes of the connection representation associated with the first connection representation indicator 240. For example, the user may be prompted to input dimensions (e.g., radius of the ball, length of the level parts, and the like), position of nodes for connecting interfaces, and material compositions (e.g., type of steel, and the like) of the ball joint. In other embodiments, the dimensions may be automatically set by the ACM 110 to a default dimension or selected automatically based on the attributes of the part representations 210g and 210e. For example, thickness and the material composition of a lever connection portions of the ball joint (as indicated by the first connection representation indicator 240) may conform to the thickness and the material composition of the portions of the part representations 210g and 210e that connect to the level connection portions of the ball joint. In addition, the radius of the ball and the ball seat of the ball joint may be set proportionally to the length and thickness of the level connection portion of the ball joint.

In some embodiments, in response to the connection representation being selected and/or the attributes of the connection representations being set in any manner described, the ACM 110 cause determination the validity of the connection representation and parts representation combination (e.g., via the validity verification module 145). In some embodiments, the ACM 110 may cause localized determination of validity of the connection representation. As described, a connection representation (e.g., as indicated by the first connection representation indicator 240) and its associated part representations (e.g., the part representation E 210e and the part representation G 210g) may form a group representation. The validity of the group representation may be verified in any suitable manner, but other part/connection representations outside of the group representation may not factored into the validity verification. In other embodiments, the entire assembly representation or a fraction thereof may be factored into the validity determination. In such cases, other part/connection representations may be factored into the validity verification.

When found to be invalid (or more information is required from the user) according to rules or criteria as described, the ACM 110 may cause the interface 160 to display the first connection representation indicator 240 in a first graphical state indicating to the user the issue (e.g., by adding the outer dotted circle 250, presenting the first connection representation indicator 240 in a first color, a cross mark, a combination thereof, and/or the like). In some embodiments, when found to be valid (or no additional information may be required by the user), the first connection representation indicator 240 may be presented in a second graphical state different from the first graphical state (e.g., by presenting the first connection representation indicator 240 in a second color, a check mark, without the outer dotted circle 250, a combination thereof, and/or the like).

Figure 3D:
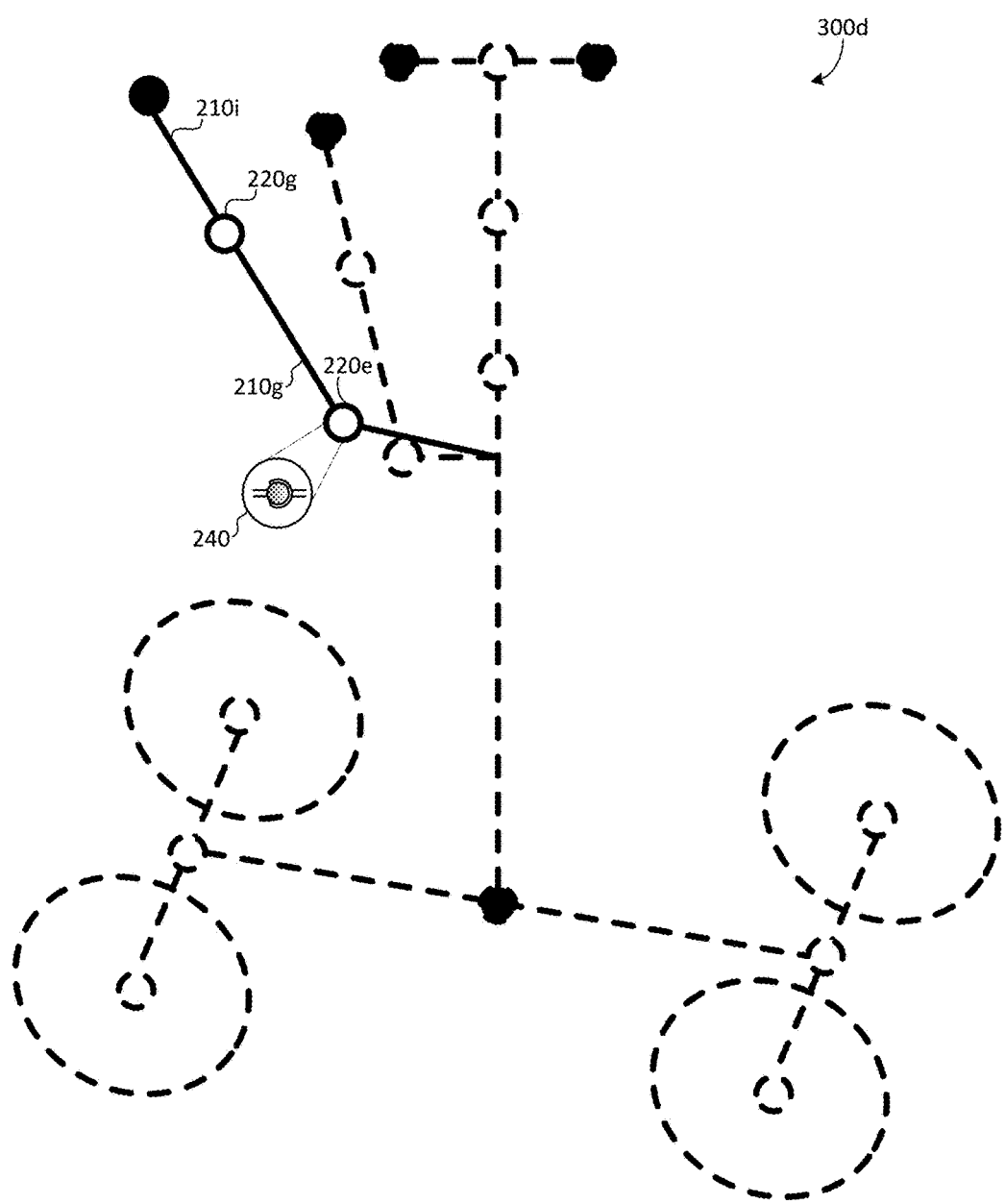
FIG. 3D illustrates an example of a fifth screen display of the assembly representation according to various embodiments.

FIG. 3D illustrates an example of a fifth screen display 300*d* of the assembly representation according to various embodiments. Referring to FIGS. 1-3D, the ACM 110 may cause the interface 160 to display the fifth screen display 300*d*. The fifth screen display 300*d* may be displayed when the connection 220*e* is being designed, configured, and/or verified.

The fifth screen display 300*d* includes the assembly representation being displayed in the idealized, three-dimensional context. As shown, a portion of the assembly representation may be displayed in one graphical state (e.g., in solid lines) for emphasis while a separate portion of the assembly representation may be displayed in another separate graphical state (e.g., in dotted lines). In some embodiments, the group representation (e.g., including the part representation G 210*g*, the first connection representation indicator 240, the part representation E 210*e*) containing the connection of interest (e.g., as indicated by the first connection representation indicator 240) may be displayed in the emphasized graphical state (highlighted, boxed, and/or the like) while other part/connection representations may be displayed in the deemphasized graphical state (faded, prevented from displaying, and/or the like).

In other embodiments, the group representation containing the connection of interest may also be displayed with at least one adjacent connection/part representation (e.g., the connection representation G 220*g*, the part representation I 210*i*) in the emphasized graphical state.

Figure 3E:
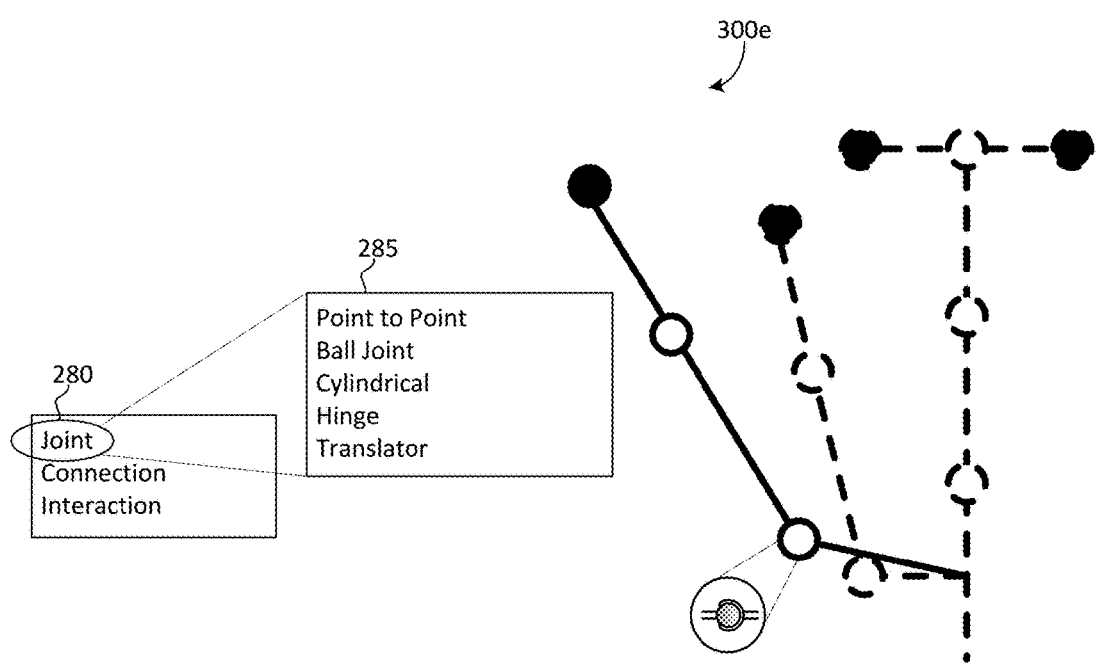
FIG. 3E illustrates an example of a sixth screen display of the assembly representation according to various embodiments.

FIG. 3E illustrates an example of a sixth screen display 300*e* of the assembly representation according to various embodiments. Referring to FIGS. 1-3E, the ACM 110 may cause the interface 160 to display the sixth screen display 300*e*. The sixth screen display 300*e* may be displayed when the connection E 220*e* is being designed, configured, and/or verified.

The fifth screen display 300*d* includes a portion of the assembly representation being displayed in the idealized, three-dimensional context. A subset of the portion of the assembly representation being displayed is in an emphasized graphical state while a separate subset of the portion of the assembly representation being displayed is in a deemphasized state. The portion of the assembly representation being displayed may be proximal to the connection of interest (e.g., the connection E 220*e*).

The fifth screen display 330*d* may be displayed when the user is reselecting a type of connection representation for the connection E 220*e* (e.g., after the connection representation is being found invalid or otherwise inappropriate). For example, a general menu 280 describing classes of connection representations may be displayed as a pop-up window or in any other suitable manner. The general menu 280 may include joint, connection, and interaction classes of connection representations, where each class may include one or more specific connection representation types. Upon interacting with an element representing a class of connection representations (e.g., "joint"), a secondary menu 285 may be displayed as a pop-up window or in any other suitable means. The secondary menu 285 may include types of connection representations associated with the selected class. For example, "point to point," "ball joint," "cylindrical," "hinge," and "translator" may be included in the class "joint."

Figure 3F:
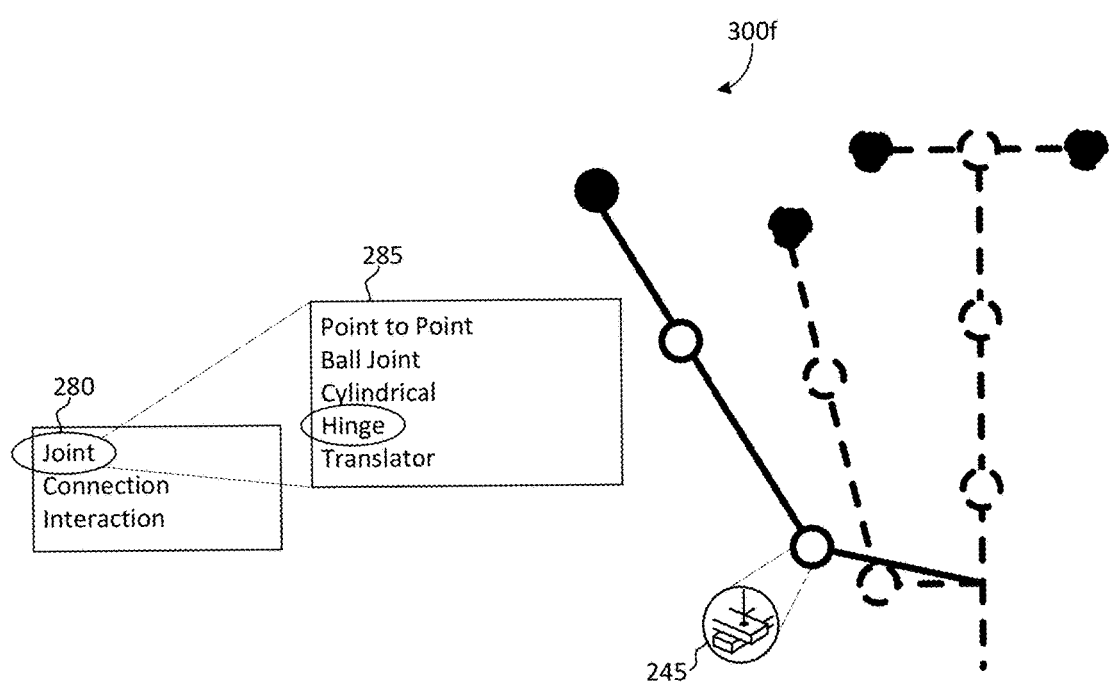
FIG. 3F illustrates an example of a seventh screen display of the assembly representation according to various embodiments.

FIG. 3F illustrates an example of a seventh screen display 300*f* of the assembly representation according to various embodiments. Referring to FIGS. 1-3F, the ACM 110 may cause the interface 160 to display the seventh screen display 300*f*. The seventh screen display 300*f* may be displayed when the connection E 220*e* is being designed, configured, and/or verified.

The user may select, via the interface 160, a type of connection representations for the connection E 220*e* from the secondary menu 285. For example, the user may select the hinge connection representation for the connection E 220*e*. In response to the selection, a second connection representation indicator 245 (e.g. indicating a hinge connection) may replace the first connection representation indicator 240 to associate with the connection E 220*e*.

Figure 3G:
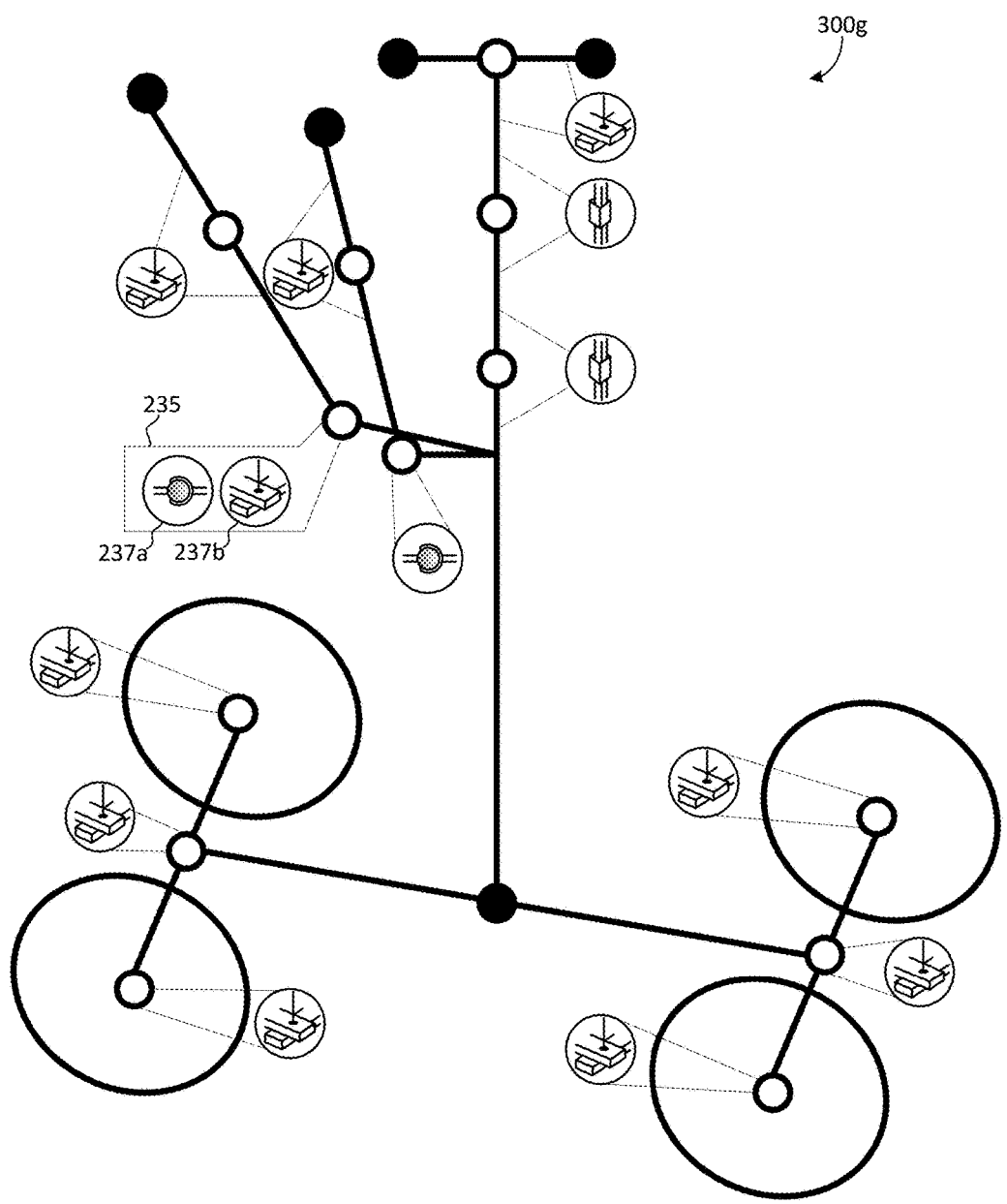
FIG. 3G illustrates an example of an eighth screen display of the assembly representation according to various embodiments.

FIG. 3G illustrates an example of an eighth screen display 300*g* of the assembly representation according to various embodiments. Referring to FIGS. 1-3G, the ACM 110 may cause the interface 160 to display the seventh screen display 300*g*. The eighth screen display 300*g* may be displayed when the connection E 220*e* is being designed, configured, and/or verified.

The user may select (or reselect), via the interface 160, a type of connection representations for the connection E 220*e* from a visual display menu 235. The visual display menu 235 may be displayed in response to the user indicating that the connection representation for the connection E 220*e* is to be selected or reselected through the interface 160. The visual display menu 235 may be displayed as a pop-up window or other suitable means. The visual display menu 235 may include elements representing different types of connection representations (e.g., the ball joint element 237*a* and the hinge element 237*b*) for the connection E 220*e*. For example, the user may select one of the elements for the connection E 220*e*.

The assembly representation as shown in the eighth screen display 300*g* may be displayed in the idealized, 3-dimensional context. Connection representation indicators 320*a*-230*d*, 230*f*-230*m* for connections other than the connection E 220*e* may be displayed by the interface 160 to provide context to the user.

Figure 4:
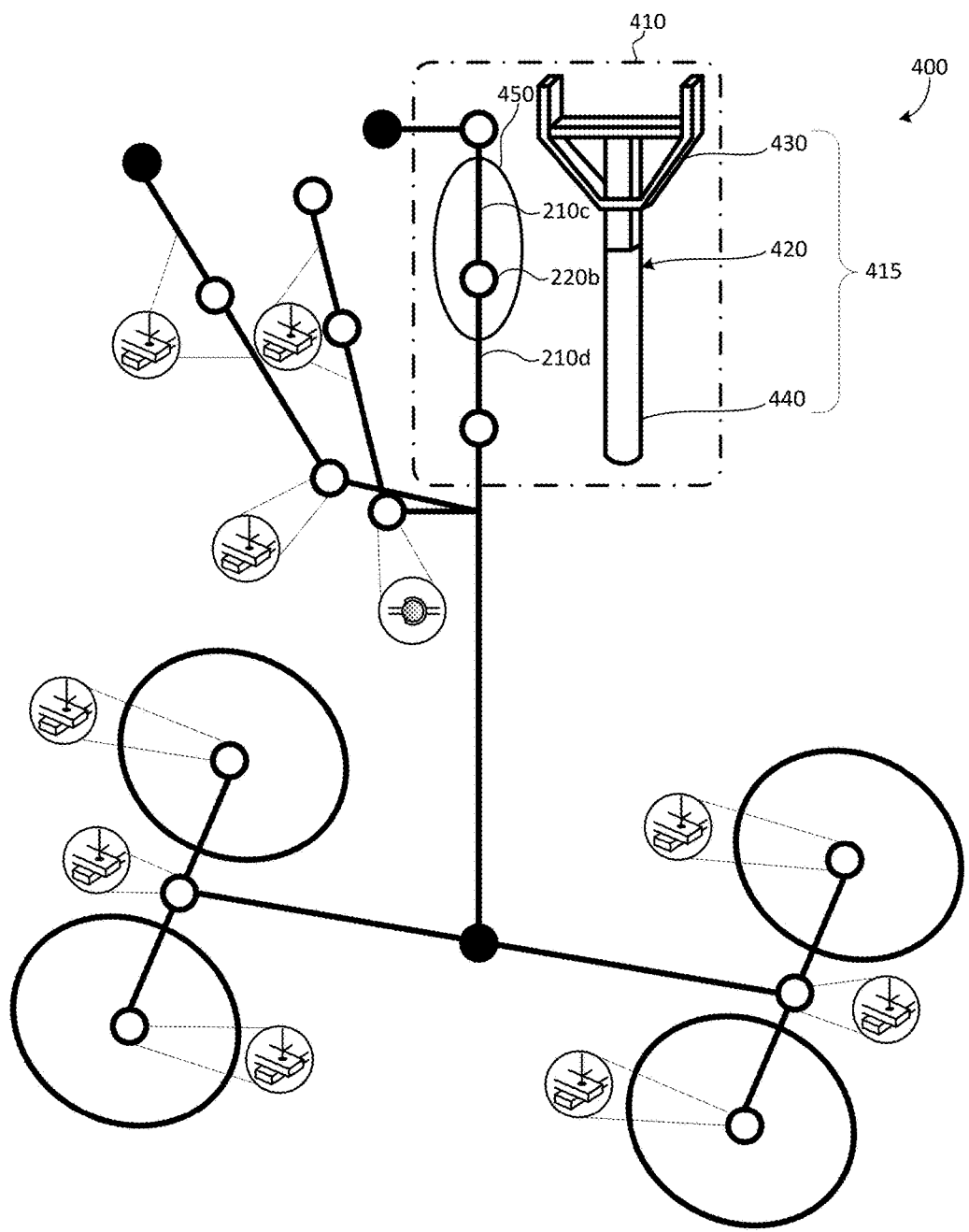
FIG. 4 illustrates an example of a ninth screen display of the assembly representation according to various embodiments.

FIG. 4 illustrates an example of a ninth screen display 400 of the assembly representation according to various embodiments. Referring to FIGS. 1-4, the ACM 110 may cause the interface 160 to display the ninth screen display 400. The ninth screen display 400 may be displayed when the connection B 220*b* is being designed, configured, and/or verified.

The assembly representation as shown in the ninth screen display 400 may be displayed in the 3-dimensional context. The assembly representation may be displayed in a hybrid format including both a more idealized level of abstraction as well as a more realized level of abstraction. For example, as shown in the ninth screen display 400, a portion of the assembly representation (e.g., a leg portion) may also be displayed in the more realized level of abstraction (e.g., as a realized component 415). The realized component 415 includes an upper portion 430, a lower portion 440, and a realized connection representation 420 therebetween. The realized component 415 corresponds to the highlighted portion 450 of the assembly representation displayed in the more idealized level of abstraction (e.g., the connection B 220b and its associated part representations: the part representation C 210C and the part representation D 210d). For example, the upper portion 430 may correspond to the part representation C 210c. The lower portion 440 may correspond to the part representation D 210d. The realized connection representation 420 may correspond to the connection B 220b.

In some embodiments, the idealized portion of the assembly representation (as shown in the highlighted portion 450) may be displayed along with the corresponding realized component 415 side-by-side for comparison in a configuration box 410. Accordingly, the ACM 110 may cause the interface 160 to display both the idealized portion (e.g., the highlighted portion 450) as well as the realized component 415 for the same connections/part such that the user may visualized the connection B 220b and its associated part representations, the part representation C 210C and the part representation D 210d, for making a decision regarding selecting/reselecting the appropriate connection representation for the connection B 220b.

Figure 5:
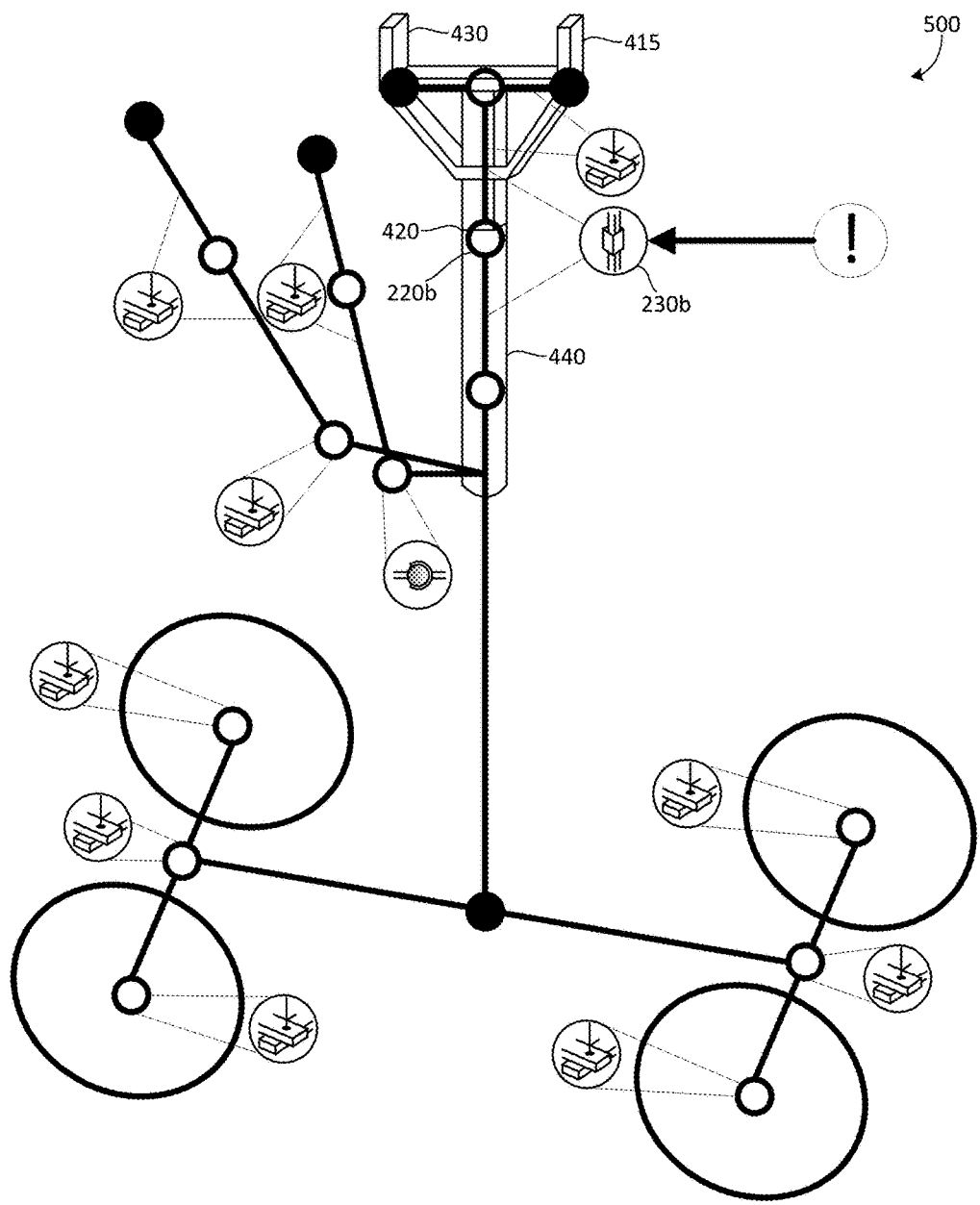
FIG. 5 illustrates an example of a tenth screen display of the assembly representation according to various embodiments.

FIG. 5 illustrates an example of a tenth screen display 500 of the assembly representation according to various embodiments. Referring to FIGS. 1-5, the ACM 110 may cause the interface 160 to display the tenth screen display 500. The tenth screen display 500 may be displayed when the connection B 220b is being designed, configured, and/or verified. The tenth screen display 500 illustrates another scenario where the hybrid format including both the idealized abstraction representation of a portion of the assembly representation is displayed with the realized abstraction representation of the same portion.

The assembly representation as shown in the tenth screen display 500 may be displayed in the 3-dimensional context. The realized component 415 (including the upper portion 430, the lower portion 440, and the realized connection representation 420) may be superimposed on the corresponding idealized portion of the assembly representation (or vice versa). The idealized portion of the assembly representation may include at least the connection of interest (e.g., in this case, the connection B 220b) and its associated part representations (e.g., the part representation C 210C and the part representation D 210d). For example, the upper portion 430 may correspond to the part representation C 210c and is superimposed on the part representation C 210, vice versa. The lower portion 440 may correspond to the part representation D 210d and is superimposed on the part representation D 210d, vice versa. The realized connection representation 420 may correspond to the connection B 220b and may be superimposed on the connection B 220b, vice versa.

In some embodiments, the connection representation indicator 230b may be displayed to indicate the type of connection representation associated with the connection 220b and/or the realized connection representation 420. For example, the connection representation indicator 230b indicates to the user that the connection representation associated with the connection 220b and/or the realized connection representation 420 is a sleeve connection.

In some embodiments, an invalidity indicator 510 may be displayed to indicate an invalid or inappropriate connection. As described, invalid connection may be found based on user input or automatically based on a set of predefined rules. Invalidity may be caused by both the connection representations and the part representations. In some embodiments, localized verifications as well as verifications based on other portions of the assembly representation may be executed to determine the validity of the connection representation of interest. The invalidity indicator 510 may include any suitable graphic indicators or visual representations showing that the connection representation associated with the connection representation indicator 230b is invalid.

Figure 6:
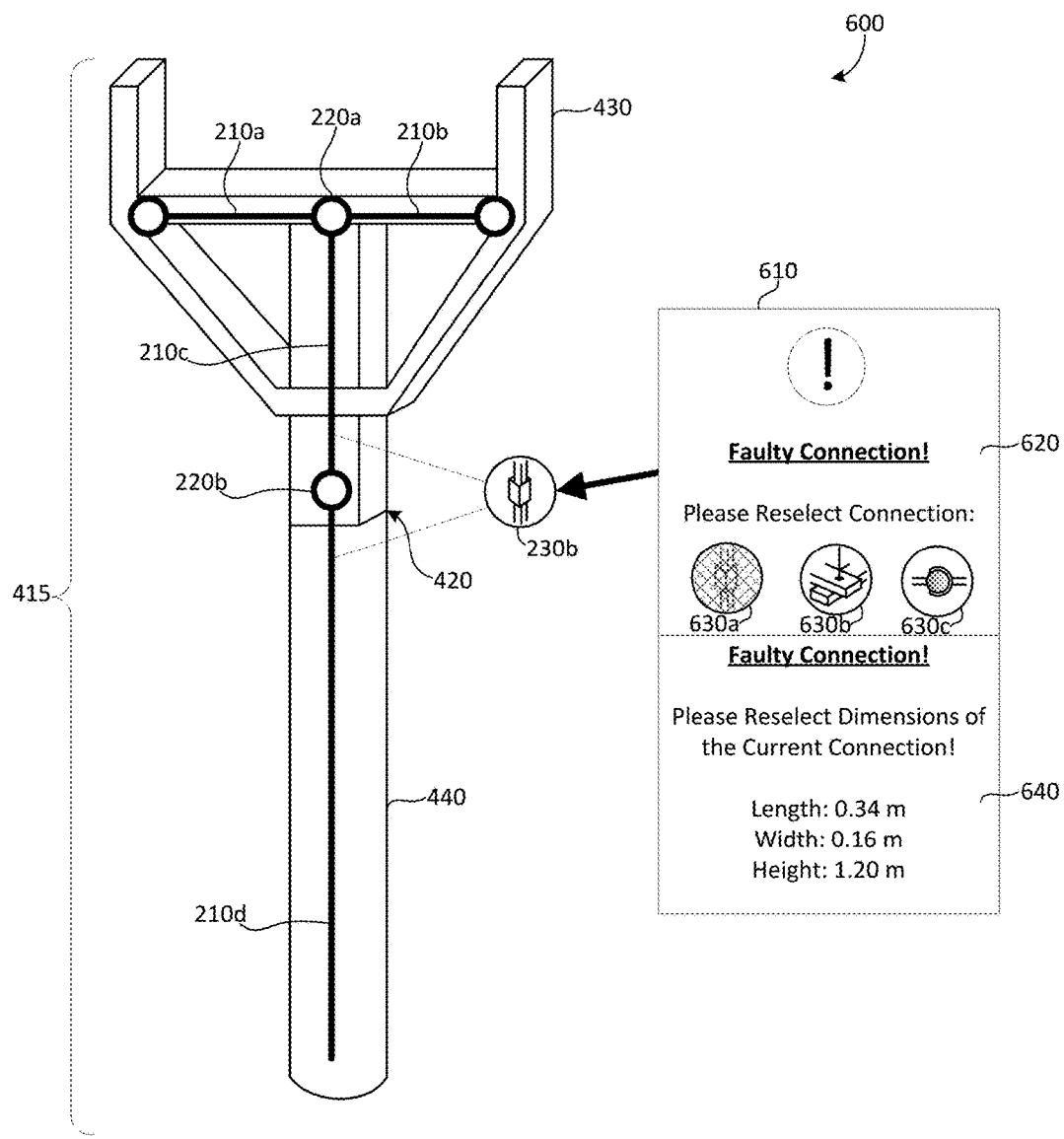
FIG. 6 illustrates an example of a eleventh screen display of the assembly representation according to various embodiments.

FIG. 6 illustrates an example of a eleventh screen display 600 of the assembly representation according to various embodiments. Referring to FIGS. 1-6, the ACM 110 may cause the interface 160 to display the eleventh screen display 600. The eleventh screen display 600 may be displayed when the connection B 220b is being designed, configured, and/or verified. The eleventh screen display 600 illustrates another scenario where the hybrid format including both the idealized abstraction representation of a portion of the assembly representation is displayed with the realized abstraction representation of the same portion.

The eleventh screen display 600 may display only the realized component 415 (including the upper portion 430, the lower portion 440, and the realized connection representation 420) superimposed on the idealized portion of the assembly representation (or vice versa). The idealized portion of the assembly representation may include at least the connection of interest (e.g., in this case, the connection B 220b) and its associated part representations (e.g., the part representation C 210C and the part representation D 210d). In addition, the eleventh screen display 600 may include some but not all idealized representations (e.g., the connection 220a, the part representation A 210a, the part representation B 210b) linking to the group representation including the connection representation of interest. The realized abstraction representation associated with the additional idealized representation may be superimposed on the additional idealized representations.

In some embodiments, a reconfiguration window 610 may be associated with the connection representation indicator 230b. The ACM 110 may cause the interface 160 to display the reconfiguration window 610 in response to the connection representation indicated by the connection representation indicator 230b is found to be invalid by the user or automatically. The reconfiguration window 610 may be a pop-up window, a drop-down menu, a combination thereof, and/or the like.

In various embodiments, the reconfiguration window 610 may include a connection type selection menu 620 and an attribute selection menu 640. The reconfiguration window 610 may display at least one connection representation types (e.g., a sleeve connection representation type 630a, hinge connection representation type 630b, ball joint representation type 630c, and the like). The connection representation types 630a-630c displayed in the reconfiguration windows 610 may be configured as user interactive elements. When selected, the selected one of the connection representation types 630a-630c may replace the current connection representation type connection representation 230b as the new connection representation type.

In some embodiments, the attribute selection menu 640 may provide interface for the user to set/reset the attributes associated with the connection representation type currently selected as indicated by the connection representation indicator 230b. For example, the attribute selection menu 640 may provide interface for setting/resetting the dimensions, material composition, a combination thereof, and/or the like.

Figure 7:
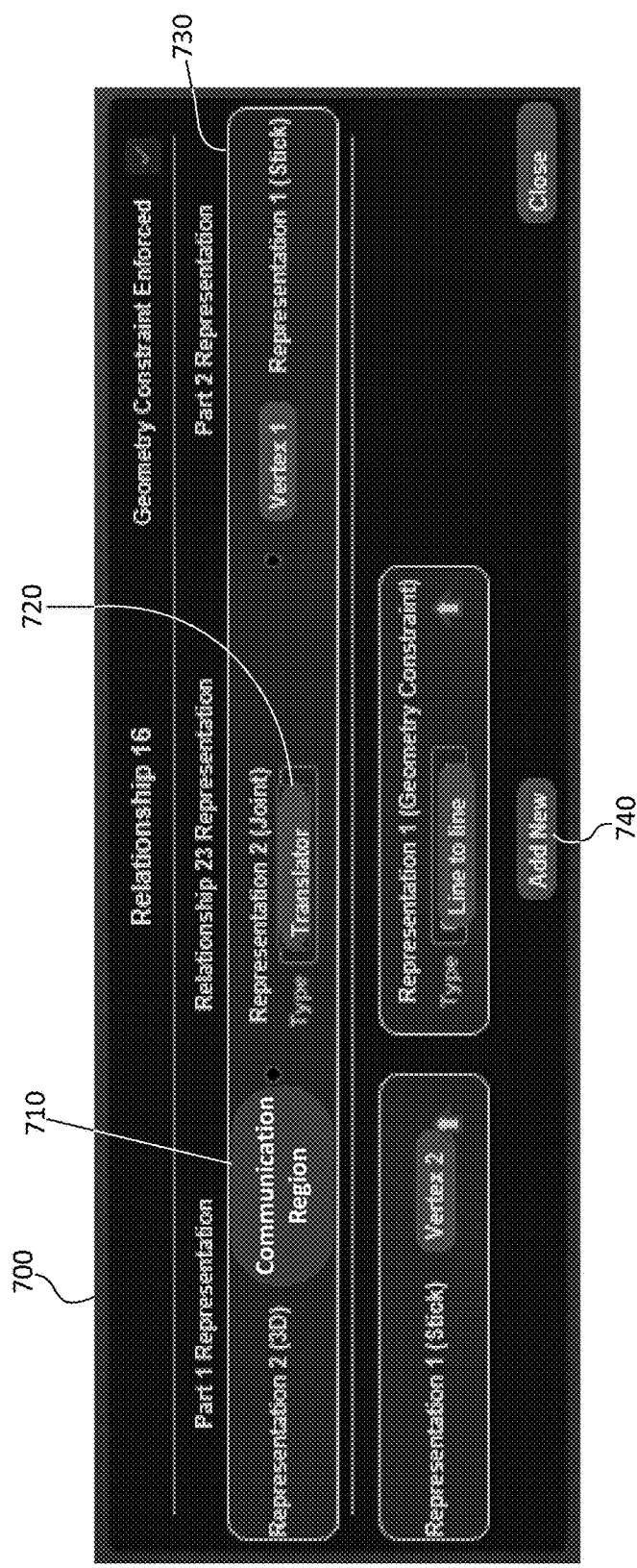
FIG. 7 illustrates an example of a validity notification window according to various embodiments.

FIG. 7 illustrates an example of a validity notification window 700 according to various embodiments. Referring to FIGS. 1-7, the ACM 110 may cause the interface 160 to display the validity notification window 700, for example, as a pop-up window displayed next to or over the assembly representation displayed in the canvas. In various embodiments, the validity notification window 700 may highlight to the user the faulty connection (between part representations and connection representations), such that the user may take actions to rectify or reconfigure the fault connection accordingly.

In some embodiments, the communication region 710 may be displayed in a highlighted, outlined, circled, or otherwise graphically emphasized fashion to notify the user (via the interface 160) that the connection representation and/or part representation associated with the communication region 710 may be faulty. The communication region 710 may be a name or code for a particular region or group representation in the assembly representation.

The validity notification window 700 may also display a type of connection representation associated with the communication region 710, namely a translator 720 connection representation. In addition, the validity notification window 700 may show a level of abstraction (stick representation 730) associated with the communication region 710. In some embodiments, the stick representation 730 may constitute the most idealized connection representation to represent a part/connection. The validity notification window 700 may include at least one new element 740 for adding additional part/connection representations in or proximal to the communication region 710.

Figure 8:
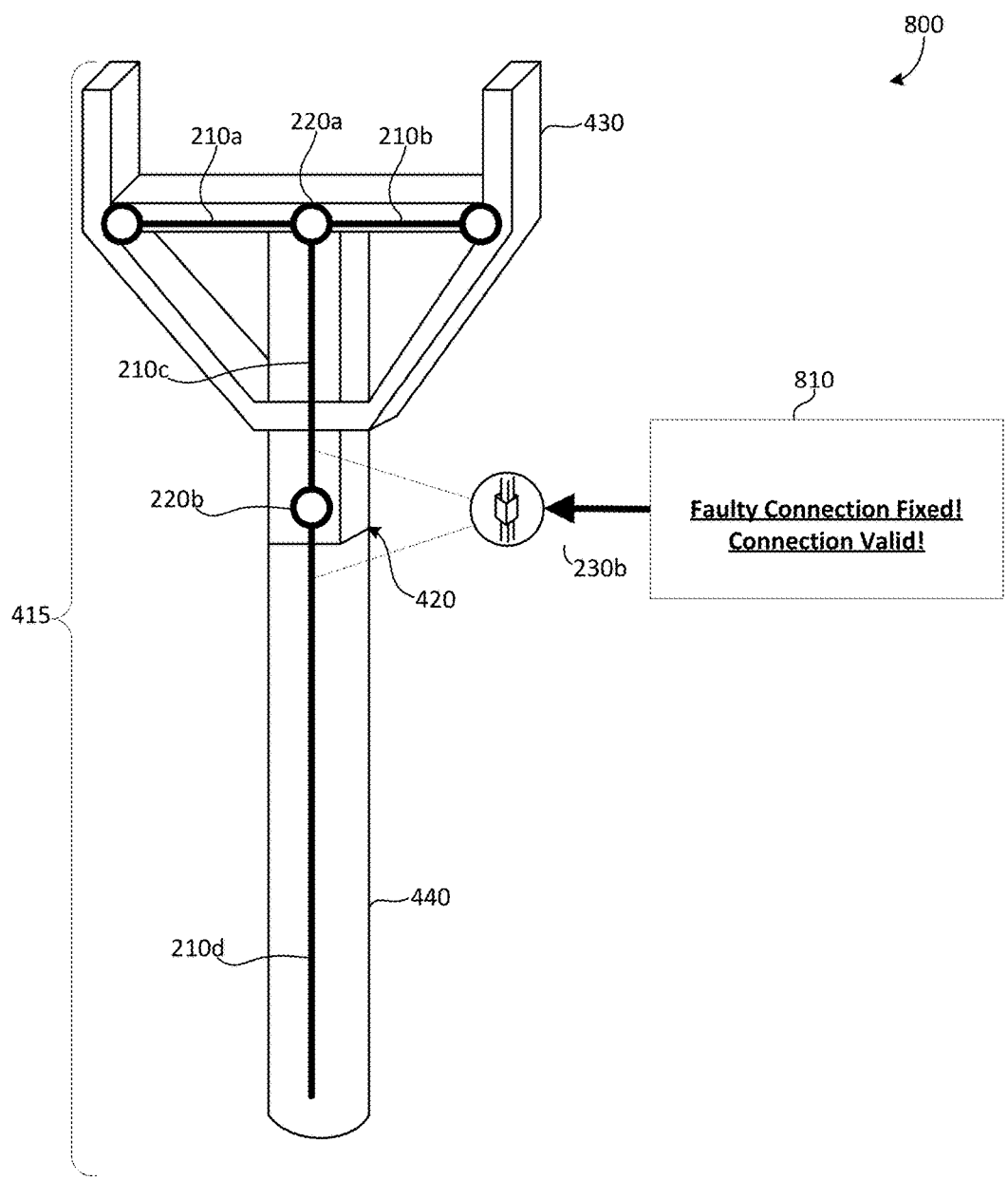
FIG. 8 illustrates an example of a thirteenth screen display of the assembly representation according to various embodiments.

FIG. 8 illustrates an example of a twelfth screen display 800 of the assembly representation according to various embodiments. Referring to FIGS. 1-8, the ACM 110 may cause the interface 160 to display the twelfth screen display 800. The twelfth screen display 800 may be displayed when the connection B 220b is being designed, configured, and/or verified. The twelfth screen display 800 illustrates another scenario where the hybrid format including both the idealized abstraction representation of a portion of the assembly representation is displayed with the realized abstraction representation of the same portion.

The twelfth screen display 800 may display only the realized component 415 (including the upper portion 430, the lower portion 440, and the realized connection representation 420) superimposed on the corresponding idealized portion of the assembly representation (or vice versa). The idealized portion of the assembly representation may include at least the connection of interest (e.g., in this case, the connection B 220b) and its associated part representations (e.g., the part representation C 210C and the part representation D 210d). In addition, the twelfth screen display 800 may include the connection 220a, the part representation A 210a, and the part representation B 210b that link to the group representation including the connection representation of interest. The realized abstraction representation associated with the additional idealized representation may be superimposed on the additional idealized representations as shown.

In some embodiments, a notification window 810 may be associated with the connection representation indicator 230b. The ACM 110 may cause the interface 160 to display the notification window 810 in response to the connection representation indicated by the connection representation indicator 230b is found to be valid after reconfiguration. The notification window 810 may be a pop-up window, a drop-down menu, a combination thereof, and/or the like.

Figure 9:
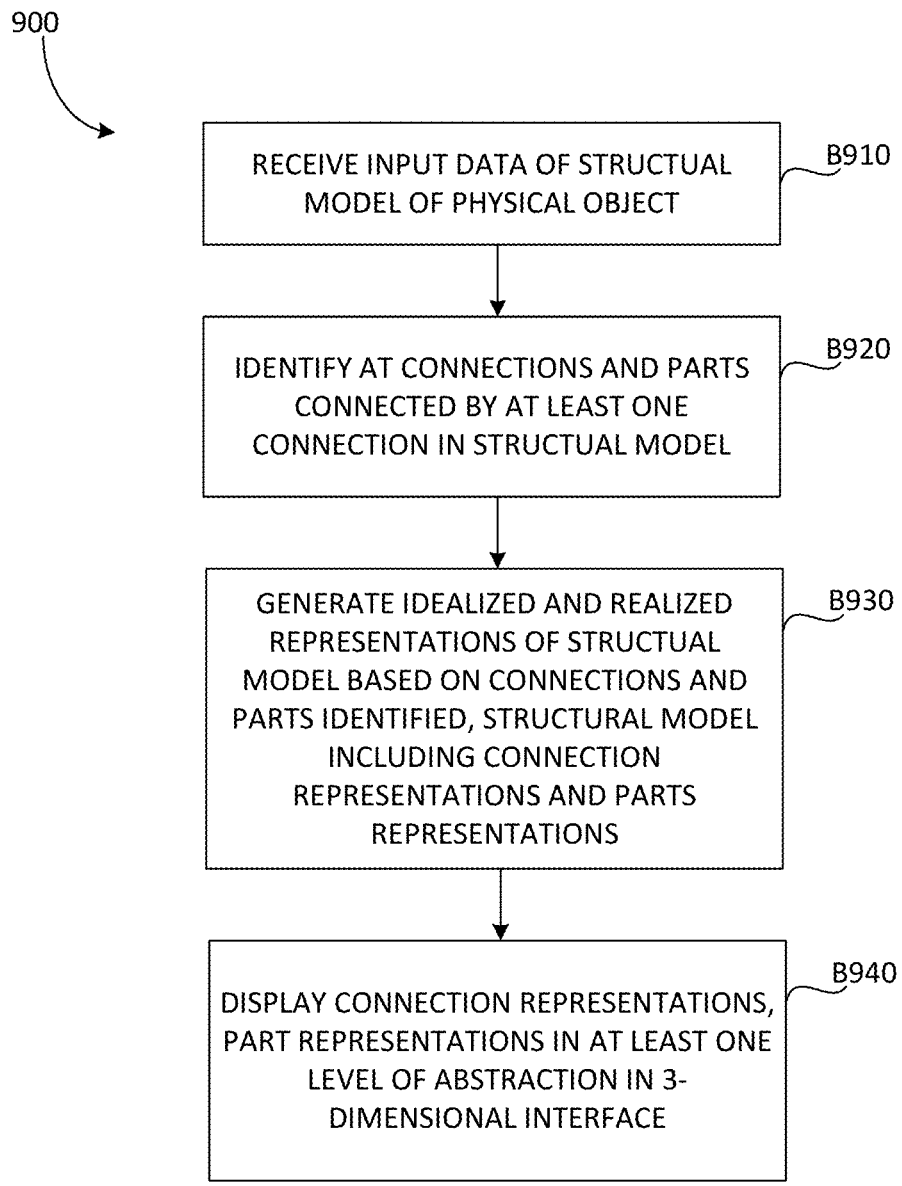
FIG. 9 is a process flow diagram illustrating an example of a method for providing connection management for a model of a physical objection according to various embodiments.

FIG. 9 is a process flow diagram illustrating an example of a method 900 for providing connection management for a model of a physical objection according to various embodiments. Referring to FIGS. 1-9, the method 900 may be performed by the ACM 110 of the simulation system 100. First at block B910, the ACM 110 may be configured to receive input data related to a structural model of a physical object. The structural model may be any suitable virtual representation of the physical object as described. In some embodiments, the ACM 110 may receive the input data from the representation import/export module 140. The user may generate input data at the representation import/export module 140 through the interface 160 (when the user designs at least a portion of the structural model). In other embodiments, the representation import/export module 140 may automatically generate the input data concerning the structural model through scanning, photography, and/or other structural imaging techniques used to capture the characteristics of the physical object.

Next at block B920, the ACM 110 may identify connections and parts connected by at least one connection within the structural model. In some embodiments, the connections and the parts may be defined by the user with the interface 160. The interface 160, being coupled to the ACM 110, may relate the user input to the ACM 110. In other embodiments, the ACM 110 may automatically define connections and parts associated therewith based on suitable algorithms that analyze the input data.

Next at block B930, the ACM 110 may generate idealized and realized representations of the structural model based on the connection and the parts identified, whereas the structural model including connection representations and part representations. In some embodiments, a connection representation and two or more part representations associated with the connection representation may form a group representation. At least one assembly representation may correspond to the physical object. One or more group representations may form an assembly representation. Each of the connection representation, part representation, group representation, and/or assembly representation may be displayed in a most idealized level of abstraction, a most realized level of abstraction, and at least one level of abstraction therebetween, in the manner described. The idealized/realized representations of a part, connection, group, and/or assembly may be generated based on user input. For example, a user may design (e.g., input with the interface 160) a part, connection, group, or assembly in a most idealized level of abstraction initially (e.g., with a dot or a line). Subsequently, the user may include additional details for the part, connection, group, or assembly to increase realization of the level of abstraction, thus moving toward a more realized level of abstraction.

Next at block B940, the ACM 110 may cause the interface 160 to display connection representations and part representations in at least one level of abstraction in a 3-dimensional interface provided by the ACM 110. It should be appreciated by one of ordinary skill in the art that group representations and assembly representations may be displayed in a similar manner. Even after the user had provided increased level of detail for a particular part, connection, group, or assembly (e.g., a more realized level of abstraction may be available), the ACM 110 may cause at least one part representation, connection representation, group representation, or assembly representation to be displayed in a more idealized level of abstraction.

For example, whereas the user is examining or otherwise reconfiguring a particular group representation, the group representation may be provided at in a more realized level of abstraction as compared to the remaining of the representations. Thus, at least a portion of the assembly representation may be displayed in one level of abstraction (e.g., a first idealized level of abstraction, where components may be simply displayed, for example, as sticks and dots) while another portion of the assembly representation may be displayed in another level of abstraction (e.g., a realized level of realization, with increased level of details as compared to the first idealized level of abstraction). The user may determine the level of abstraction for each component via the interface 160.

Figure 10:
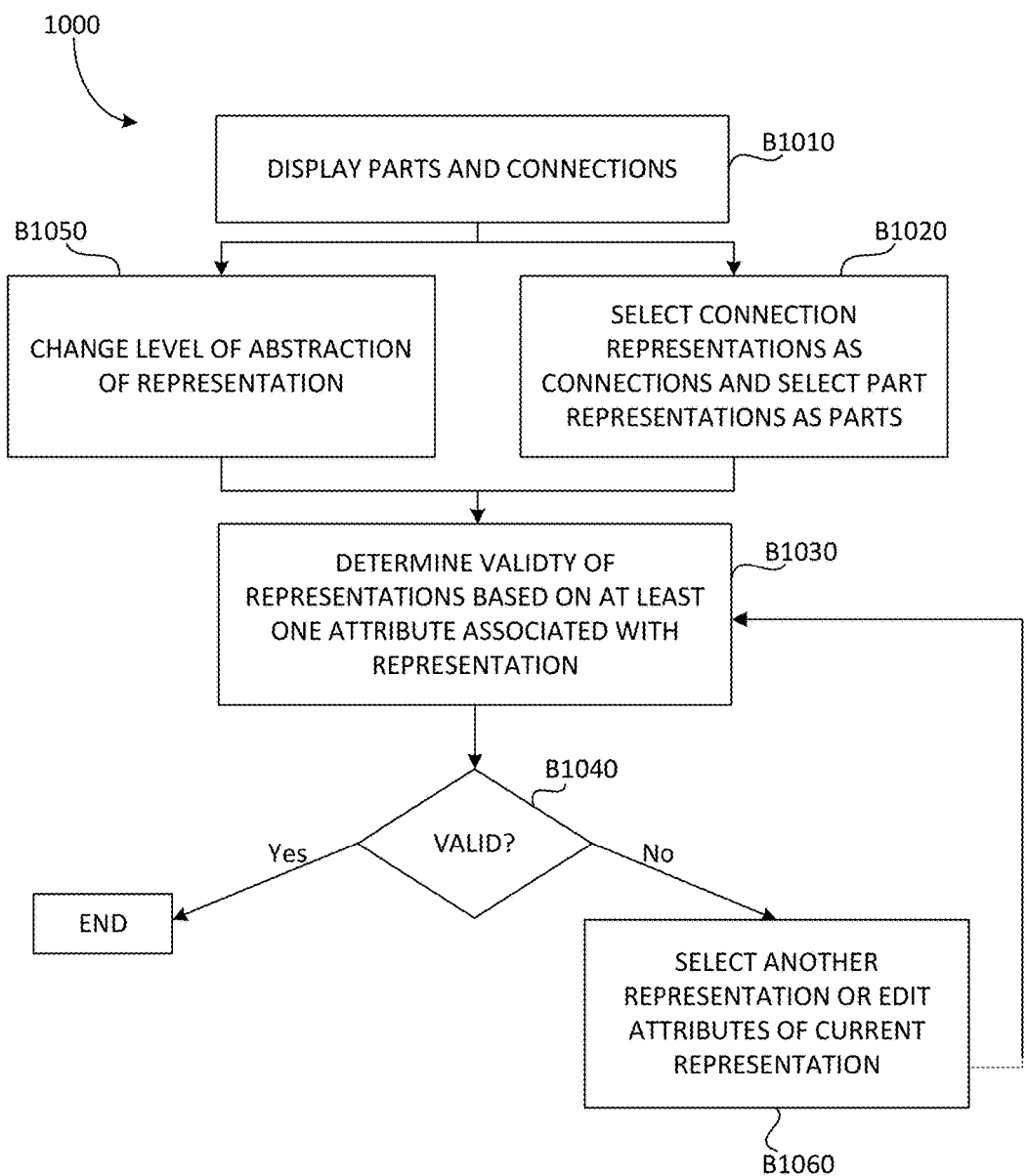
FIG. 10 is a process flow diagram illustrating an example of a connection validity verification method for providing verifying connection validity for a model of a physical objection according to various embodiments.

FIG. 10 is a process flow diagram illustrating an example of a connection validity verification method 1000 for providing verifying connection validity for a model of a physical objection according to various embodiments. Referring to FIGS. 1-10, the connection validity verification method 1000 may be performed by the ACM 110 of the simulation system 100. First at block B1010, the ACM 110 may be configured to cause the display 160 to display parts and connections.

Next at block B1020, the ACM 110 may be configured to select connection representations as connections and/or to select part representations as parts in the manner described. For example, the ACM 110 may receive user input via the interface 160 regarding the a selection of representation for the connections and/or parts. At block B1050, the ACM 110 may be configured to change a level of abstraction of a representation. The representation may be a part representation and/or a connection representation. In some embodiments, representation may be changed to a more idealized level of abstraction or to a more realized level of abstraction.

After either block B1020 or B1050, the ACM 110 may be configured to determine validity of the representations based on at least one attributed associated with the representation, at block B1030. The attributes may include, with respect to the representations, the dimensions (e.g., length, width, height, radius), material characteristics (e.g., flexibility, durability, material composition, color), nodes/vertices locations and numbers, a combination thereof, and/or the like. In a particular example, the ACM 110 may determine whether a connection representation and a part representation geometrically fit (e.g., snap). In some embodiments, the user may determine the validity by manually inspect each connection representation and part representation. In other embodiments, the ACM 110 may determine if the link between a connection representation and at least one part representation is valid. In some embodiments, a connection is deemed to be valid when no further user input may be required to resolve the actual intended connection.

Whereas the representations are determined to valid at block B1040, the connection validity verification process 1000 ends (B1040:YES). On the other hand, whereas the representations are determined to be invalid at block B1040 (B1040:NO), the ACM 110 may be configured to select another representation (e.g., part representation and/or connection representation) or edit attributes of the current representation, at block B1060. The user may select another representation or edit the attributes of the current representation via the interface 160. Next, the validity of the newly selected representation or the current representation having its attributed edited may be determined based on the attributes at block B1030.

Figure 11C:
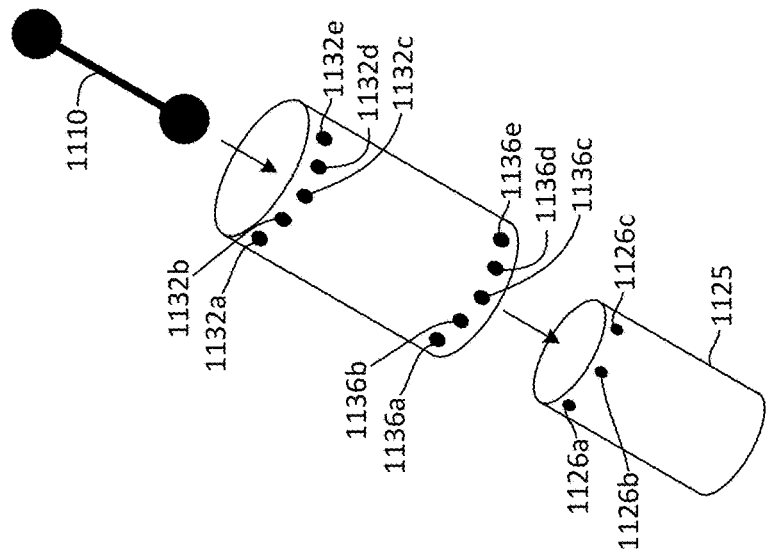
FIGS. 11A-11C are display diagrams illustrating representation verification and revision process according to various embodiments.
Figure 11B:
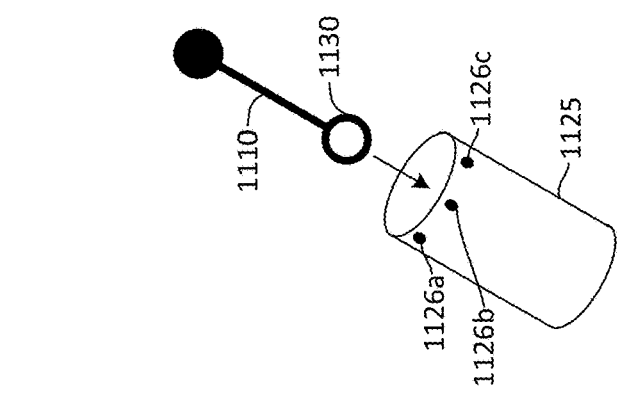
Figure 11A:
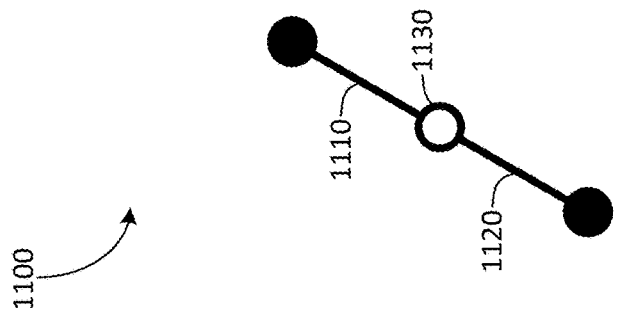

FIGS. 11A-11C are display diagrams illustrating representation verification and revision process according to various embodiments. FIGS. 11A-11C may correspond to blocks B1020, B1050, B1030, and B1040 of the connection validity verification method 1000. Referring to FIGS. 1-11A, the ACM 110 may cause the interface 160 to display the group representation 1100 including a first part representation 1110, a second part representation 1120, and a connection representation 1130. The group representation 1100 may be a group representation of interest (i.e., the connection validity is to be determined as the issue at hand). Each of the first part representation 1110, the second part representation 1120, and the connection representation 1130 may be displayed in a most idealized level of abstraction, at least initially. The first part representation 1110 and the second part representation 112 may be displayed as sticks while the connection representation 1130 may be displayed as a dot. Each of the sticks and dots may represent point of pass, inertia, or the like for the corresponding connection or part, in the manner described. In some embodiments, the user may have design the group representation in the most idealized level of abstraction earlier in time, in the beginning stages of designing.

Referring to FIGS. 1-11B, the level of abstraction for the second part representation 1120 may be altered according to block B1050 to a more realized level of abstraction (e.g., a third part representation 1125, which may be of a cylindrical shape). In other embodiments, the third part representation 1125 may be a representation selected for the part at block B1020. The third part representation 1125 may include three nodes (e.g., a first node 1126a, a second node 1126b, and a third node 1126c). The nodes (or the vertices) may be defined by the user via the interface 160 or by the ACM 110 automatically according to modeling protocols and definitions. As compared to the second part representation, where only a single point may grab onto the connection representation 1130 (which in turn is connected to the first part representation 1110), three nodes may potentially be connected to the connection representation 1130.

As such, the ACM 110 may determine that the linkage between the third part representation 1125 and the connection representation 1130 to be invalid (e.g., at block B1030 and B1040) given that the ACM 110 could not determine which of the nodes 1126a-1126c that the connection representation 1130 should grab unto. The ACM 110 may request and receive, through the interface 160, user input as to which one of the nodes 1126a-1126c should receive the connection representation 1130. In a non-limiting example as shown, the user input may specify that, the dot representing the connection representation 1130 should be received by the middle node 1126b.

Referring to FIGS. 1-11B, the level of abstraction for the connection representation 1130 may be altered according to block B1050 to a more realized level of abstraction (e.g., the secondary connection representation 1135, which may be a cylindrical sleeve connection). The secondary connection representation 1135 may include 5 nodes on each end for receive the third part representation 1125 at one end and the first part representation 1110 at the other end.

As such, the ACM 110 may determine that the linkage between the third part representation 1125 and the secondary connection representation 1135 to be invalid (e.g., at block B1030 and B1040) given that the ACM 110 could not determine on which of the nodes 1126a-1126c would each of the nodes 1136a-1136e of the secondary connection representation 1135 grab unto. The ACM 110 may request and receive, through the interface 160, user input. In a non-limiting example, the user input may specify that, the middle node 1136c of the secondary connection representation 1135 may correspond to the middle node 1126b of the third part representation 1125, the node 1136b (second from left) of the secondary connection representation 1135 may correspond to the leftmost node 1126a of the third part representation 1125, the node 1136d (second from right) of the secondary connection representation 1135 may correspond to the rightmost node 1126c of the third part representation 1125.

With respect to the other end of the secondary connection representation 1135, the ACM 110 may determine that the linkage between the first part representation 1110 and the secondary connection representation 1135 to be invalid (e.g., at block B1030 and B1040) given that the ACM 110 could not determine which of the nodes 1132a-1132d that the first part representation 1110 should grab unto. The ACM 110 may request and receive, through the interface 160, user input as to which one of the nodes 1132a-1132d should receive the first part representation 1110. For example, the user input may specify that the first part representation 1110 should be received by the middle node 1132c.

In addition to nodes and vertices of a mesh surface or volume, implementations of the ACM 110 may extend to general geometry of the part representations and connection representations. For example, when contacting surfaces or edges of a connection representation and a part representation do not have approximately the same dimensions, the ACM 110 may request user input as to the exact contact location.

Similarly, the ACM 110 may perform validity verification checks (and receive user guidance) when an existing representation (connection/part) has been replaced with a new representation, and the nodes/dimensions do not match up.

The terms "system", "logic", "data processing apparatus" or "computing device" encompasses all kinds of circuits, apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, networked systems or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions. The machine-executable instructions may be executed on any type of computing device (e.g., computer, laptop, etc.) or may be embedded on any type of electronic device (e.g., a portable storage device such as a flash drive, etc.).

Although the figures may show a specific order of method steps, the order of the steps may differ from what is depicted. Also, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method, comprising:
    displaying a structural assembly representation of a physical object, the structural assembly representation comprising a plurality of parts and a connection connecting at least two of the plurality of parts;
    selecting a first connection representation to associate with the connection based on a first user input corresponding to the first connection representation;
    selecting a plurality of part representations to associate with the plurality of parts based on a second user input corresponding to each of the plurality of part representations;
    displaying, in a first level of abstraction, the first connection representation;
    displaying, in a second level of abstraction, a first part representation of the plurality of part representations, the first level of abstraction and the second level of abstraction being different levels of abstraction, the different levels of abstraction correspond to different numbers of features being shown to a user via a display; and at least one of:
the first level of abstraction is more realized as displayed and less idealized as displayed than the second level of abstraction; and
the first level of abstraction is less realized as displayed and more idealized as displayed than the second level of abstraction.

2. The method of claim 1, further comprising grouping the first connection representation and at least two of the plurality of part representations in a group representation, wherein:
the group representation is displayed in a third level of abstraction;
the part representations and secondary connection representation(s) other than contained in the group representation are displayed in a fourth level of abstraction; and
the third level of abstraction is more detailed as displayed than the fourth level of abstraction.

3. The method of claim 1, wherein:
the first level of abstraction corresponds to displaying in more detailed than the second level of abstraction is displayed.

4. The method of claim 3, further comprising:
displaying the first part representation in a third level of abstraction, the third level of abstraction is more detailed than the second level of abstraction; and
receiving user input regarding an interface between the first connection representation and the first part representation.

5. The method of claim 1, wherein the selecting the first connection representation comprises:
displaying a plurality of connection representations; and
receiving a user input indicating the first connection representation.

6. The method of claim 1, wherein the selecting the plurality of part representations comprises:
displaying potential part representations; and
receiving a user input indicating the plurality of part representations.

7. The method of claim 1, further comprising determining connectivity validity between the first connection representation and one of the plurality of part representations, wherein determining connectivity validity comprises at least one of:
evaluating the connectivity validity between the first connection representation and one of the plurality of part representations based on validity verification results obtained for validity verification of the structural assembly representation executed based on the first connection representation and the one of the plurality of part representations; and
accepting a user input indicating the validity of the first connection representation.

8. The method of claim 7, wherein the connectivity validity between the first connection representation and the one of the plurality of part representations is determined based on at least one attribute associated with at least one of the first connection representation and the one of the plurality of part representations.

9. The method of claim 1, further comprising displaying the first connection representation and the plurality of part representations in a three-dimensional interface.

10. The method of claim 1, further comprising displaying the assembly representation in one of:
a third level of abstraction; and
a fourth level of abstraction, wherein the third level of abstraction is more detailed as displayed than the fourth level of abstraction.

11. A computer-readable medium containing computer instructions which, when executed, causes a processor of a computer to:
display a structural assembly representation of a physical object, the structural assembly representation comprising a plurality of parts and a connection connecting at least two of the plurality of parts;
select a first connection representation to associate with the connection based on a first user input corresponding to the first connection representation;
select a plurality of part representations to associate with the plurality of parts based on a second user input corresponding to each of the plurality of part representations;
display, in a first level of abstraction, the first connection representation;
display, in a second level of abstraction, a first part representation of the plurality of part representations, the first level of abstraction and the second level of abstraction being different levels of abstraction, the different levels of abstraction correspond to different numbers of features being shown to a user via a display; and at least one of:
the first level of abstraction is more realized as displayed and less idealized as displayed than the second level of abstraction; and
the first level of abstraction is less realized as displayed and more idealized as displayed than the second level of abstraction.

12. The computer-readable medium of claim 11, the processor is further caused to group the first connection representation and the at least two of the plurality of part representations in a group representation, wherein:
the group representation is displayed in a third level of abstraction;
the part representations and secondary connection representation(s) other than contained in the group representation are displayed in a fourth level of abstraction; and
the third level of abstraction is more detailed as displayed than the fourth level of abstraction.

13. The computer-readable medium of claim 11, wherein to select the first connection representation comprises:
to display a plurality of connection representations; and
to receive a user input indicating the first connection representation.

14. The computer-readable medium of claim 11, to select the plurality of part representations comprises:
to display potential part representations; and
to receive a user input indicating the plurality of part representations.

15. The computer-readable medium of claim 11, the processor is further caused to determine connectivity validity between the first connection representation and one of the plurality of part representations, wherein to determine connectivity validity comprises at least one of:
to evaluate the connectivity validity between the first connection representation and one of the plurality of part representations based on validity verification results obtained for validity verification of the structural assembly representation executed based on the first connection representation and the one of the plurality of part representations; and to accept a user input indicating the validity of the first connection representation.

16. The computer-readable medium of claim 15, wherein the connectivity validity between the first connection representation and the one of the plurality of part representations is determined based on at least one attribute associated with at least one of the first connection representation and the one of the plurality of part representations.

17. The computer-readable medium of claim 11, the processor is further caused to display the first connection representation and the plurality of part representations in a three-dimensional interface.

18. The computer-readable medium of claim 11, the processor is further cause to display the assembly representation in one of:
   a third level of abstraction; and
   a fourth level of abstraction, wherein the third level of abstraction is more detailed as displayed than the fourth level of abstraction.

19. An apparatus, comprising
   means for displaying a structural assembly representation of a physical object, the structural assembly representation comprising a plurality of parts and a connection connecting at least two of the plurality of parts;
   means for selecting a first connection representation to associate with the connection based on a first user input corresponding to the first connection representation;
   means for selecting a plurality of part representations to associate with the plurality of parts based on a second user input corresponding to each of the plurality of part representations;
   means for displaying, in a first level of abstraction, the first connection representation;
   means for displaying, in a second level of abstraction, a first part representation of the plurality of part representations, the first level of abstraction and the second level of abstraction being different levels of abstraction, the different levels of abstraction correspond to different numbers of features being shown to a user via a display; and at least one of:
   the first level of abstraction is more realized as displayed and less idealized as displayed than the second level of abstraction; and
   the first level of abstraction is less realized as displayed and more idealized as displayed than the second level of abstraction.

20. The apparatus of claim 19, further comprising means for grouping the first connection representation and the at least two of the plurality of part representations in a group representation, wherein:
   the group representation is displayed in a third level of abstraction;
   the part representations and secondary connection representation(s) other than contained in the group representation are displayed in a fourth level of abstraction; and
   the third level of abstraction is more detailed as displayed than the fourth level of abstraction.

21. The method of claim 1, wherein
   one of the first level of abstraction and the second level of abstraction that is more realized and less idealized is a more detailed, faithful, and refined display representation as a display representation of the other one of the first level of abstraction and the second level of abstraction; and
   one of the first level of abstraction and the second level of abstraction that is less realized and more idealized is a less detailed, high-level, and simple display representation as a display representation of the other one of the first level of abstraction and the second level of abstraction.

* * * * *